(12) United States Patent
Kim et al.

(10) Patent No.: US 10,347,791 B2
(45) Date of Patent: Jul. 9, 2019

(54) NANOWIRES OR NANOPYRAMIDS GROWN ON GRAPHITIC SUBSTRATE

(71) Applicants: CRAYONANO AS, Trondheim (NO); NORWEGIAN UNIVERSITY OF SCIENCE AND TECHNOLOGY (NTNU), Trondheim (NO)

(72) Inventors: Dong Chul Kim, Trondheim (NO); Ida Marie E. Høiaas, Trondheim (NO); Carl Philip J. Heimdal, Oslo (NO); Bjørn Ove M. Fimland, Trondheim (NO); Helge Weman, Ecublens (CH)

(73) Assignees: CRAYONANO AS, Trondheim (NO); NORWEGIAN UNIVERSITY OF SCIENCE AND TECHNOLOGY (NTNU), Trondheim (NO)

( * ) Notice: Subject to any disclaimer, the term of this patent is extended or adjusted under 35 U.S.C. 154(b) by 0 days.

(21) Appl. No.: 15/744,457

(22) PCT Filed: Jul. 13, 2016

(86) PCT No.: PCT/EP2016/066696
§ 371 (c)(1),
(2) Date: Jan. 12, 2018

(87) PCT Pub. No.: WO2017/009395
PCT Pub. Date: Jan. 19, 2017

(65) Prior Publication Data
US 2018/0204976 A1      Jul. 19, 2018

(30) Foreign Application Priority Data

Jul. 13, 2015 (GB) .................................. 1512230.2
Jan. 5, 2016 (GB) .................................. 1600150.5

(51) Int. Cl.
 *H01L 31/00* (2006.01)
 *H01L 33/00* (2010.01)
 (Continued)

(52) U.S. Cl.
 CPC ...... *H01L 33/08* (2013.01); *H01L 31/035227* (2013.01); *H01L 33/06* (2013.01);
 (Continued)

(58) Field of Classification Search
 CPC ......... H01L 33/08; H01L 33/06; H01L 33/18; H01L 33/24; H01L 33/44;
 (Continued)

(56) References Cited

U.S. PATENT DOCUMENTS 7,335,908 B2 * 2/2008 Samuelson ............ B82Y 10/00
                                                    257/12
7,442,575 B2   10/2008 Coffer et al.
(Continued)

FOREIGN PATENT DOCUMENTS

CN       102376817      3/2012
EP         1829141      9/2007
(Continued)

OTHER PUBLICATIONS

Bonaccorsco et al., Graphene photonics and optoelectronics, Nature Photonics, 2010, 4, 611.
(Continued)

*Primary Examiner* — Nikolay K Yushin
(74) *Attorney, Agent, or Firm* — Meunier Carlin & Curfman LLC

(57) ABSTRACT

A composition of matter comprising: a graphitic substrate optionally carried on a support; a seed layer having a thickness of no more than 50 nm deposited directly on top of said substrate, opposite any support; and an oxide or nitride masking layer directly on top of said seed layer;
(Continued)

wherein a plurality of holes are present through said seed layer and through said masking layer to said graphitic substrate; and wherein a plurality of nanowires or nanopyramids are grown from said substrate in said holes, said nanowires or nanopyramids comprising at least one semiconducting group III-V compound.

19 Claims, 6 Drawing Sheets

(51) Int. Cl.
| | | |
|---|---|---|
| H01L 33/08 | (2010.01) | |
| H01L 31/0352 | (2006.01) | |
| H01L 33/18 | (2010.01) | |
| H01L 33/24 | (2010.01) | |
| H01L 33/44 | (2010.01) | |
| H01L 33/06 | (2010.01) | |

(52) U.S. Cl.
CPC .............. *H01L 33/18* (2013.01); *H01L 33/24* (2013.01); *H01L 33/44* (2013.01)

(58) Field of Classification Search
CPC ....... H01L 31/035227; H01L 31/02363; H01L 31/0304; B82Y 40/00; B82Y 20/00; B82Y 99/00
See application file for complete search history.

(56) References Cited

U.S. PATENT DOCUMENTS

| | | | |
|---|---|---|---|
| 7,594,982 | B1 | 9/2009 | Sager et al. |
| 7,608,147 | B2 | 10/2009 | Samuelson et al. |
| 7,911,035 | B2 | 3/2011 | Seifert et al. |
| 7,965,960 | B2 | 6/2011 | Kim et al. |
| 8,417,153 | B2 | 4/2013 | Kim et al. |
| 8,440,350 | B1 | 5/2013 | Verbrugge et al. |
| 2002/0175408 | A1 | 11/2002 | Majumdar et al. |
| 2003/0044608 | A1 | 3/2003 | Yoshizawa et al. |
| 2004/0075464 | A1* | 4/2004 | Samuelson ............ B82Y 10/00 326/37 |
| 2006/0125056 | A1 | 6/2006 | Samuelson et al. |
| 2006/0188774 | A1 | 8/2006 | Niu et al. |
| 2007/0177138 | A1 | 8/2007 | Esmaeili |
| 2007/0177139 | A1 | 8/2007 | Kamins et al. |
| 2007/0212538 | A1 | 9/2007 | Niu |
| 2008/0036038 | A1 | 2/2008 | Hersee et al. |
| 2008/0081439 | A1 | 4/2008 | Coffer et al. |
| 2008/0142066 | A1 | 6/2008 | Plissonnier et al. |
| 2008/0142926 | A1 | 6/2008 | Seifert et al. |
| 2008/0191317 | A1 | 8/2008 | Cohen et al. |
| 2009/0057649 | A1 | 3/2009 | Sutter et al. |
| 2009/0176159 | A1 | 7/2009 | Zhamu et al. |
| 2009/0191317 | A1 | 7/2009 | Lin |
| 2009/0200540 | A1 | 8/2009 | Bjoerk et al. |
| 2009/0235862 | A1 | 9/2009 | Cha et al. |
| 2009/0293946 | A1 | 12/2009 | Lin et al. |
| 2010/0035412 | A1 | 2/2010 | Samuelson et al. |
| 2010/0155702 | A1 | 6/2010 | Wernersson et al. |
| 2010/0171096 | A1 | 7/2010 | Sutter et al. |
| 2010/0252808 | A1 | 10/2010 | Samuelson et al. |
| 2010/0314617 | A1* | 12/2010 | Ito ...................... B81C 1/00111 257/43 |
| 2010/0327258 | A1 | 12/2010 | Lee et al. |
| 2011/0030991 | A1 | 2/2011 | Veerasamy et al. |
| 2011/0121264 | A1* | 5/2011 | Choi ...................... B82Y 10/00 257/14 |
| 2011/0129675 | A1 | 6/2011 | Choi et al. |
| 2011/0133061 | A1 | 6/2011 | Yu et al. |
| 2011/0163292 | A1 | 7/2011 | Wang et al. |
| 2011/0168256 | A1 | 7/2011 | Wang et al. |
| 2011/0175059 | A1 | 7/2011 | Kahen et al. |
| 2011/0177683 | A1 | 7/2011 | Kahen et al. |
| 2011/0220171 | A1 | 9/2011 | Mathai et al. |
| 2011/0220864 | A1 | 9/2011 | Kim et al. |
| 2011/0240099 | A1 | 10/2011 | Ellinger et al. |
| 2011/0254034 | A1 | 10/2011 | Konsek et al. |
| 2011/0272723 | A1 | 11/2011 | Ha et al. |
| 2011/0313194 | A1 | 12/2011 | Lee et al. |
| 2012/0021554 | A1 | 1/2012 | Neel et al. |
| 2012/0041246 | A1 | 2/2012 | Scher et al. |
| 2012/0068122 | A1 | 3/2012 | Kranbuehl et al. |
| 2012/0068153 | A1 | 3/2012 | Seong et al. |
| 2012/0068157 | A1 | 3/2012 | Kub et al. |
| 2012/0090057 | A1 | 4/2012 | Cohen et al. |
| 2012/0132930 | A1 | 5/2012 | Young et al. |
| 2012/0135158 | A1 | 5/2012 | Freer et al. |
| 2012/0141799 | A1 | 6/2012 | Kub et al. |
| 2012/0145549 | A1 | 6/2012 | Cho et al. |
| 2012/0192931 | A1 | 8/2012 | Jeon et al. |
| 2012/0241192 | A1 | 9/2012 | Cai et al. |
| 2012/0270054 | A1 | 10/2012 | Hong et al. |
| 2013/0158322 | A1 | 6/2013 | Nyce et al. |
| 2013/0187128 | A1 | 7/2013 | Yi et al. |
| 2013/0213470 | A1 | 8/2013 | Yi et al. |
| 2013/0221322 | A1 | 8/2013 | Ohlsson et al. |
| 2013/0221385 | A1 | 8/2013 | Shibata et al. |
| 2013/0231470 | A1 | 9/2013 | Iacobelli |
| 2013/0280894 | A1 | 10/2013 | Lee et al. |
| 2013/0311363 | A1 | 11/2013 | Ramaci et al. |
| 2013/0334497 | A1 | 12/2013 | Weman et al. |
| 2014/0151826 | A1 | 6/2014 | Kelber et al. |
| 2014/0161730 | A1 | 6/2014 | Sitharaman et al. |
| 2014/0182668 | A1 | 7/2014 | Pacifici et al. |
| 2014/0252316 | A1 | 9/2014 | Yan et al. |
| 2014/0293164 | A1 | 10/2014 | Kim et al. |
| 2015/0076450 | A1 | 3/2015 | Weman et al. |
| 2015/0194549 | A1 | 7/2015 | Fimland et al. |
| 2015/0311363 | A1 | 10/2015 | Park et al. |
| 2016/0005751 | A1 | 1/2016 | Tsui et al. |

FOREIGN PATENT DOCUMENTS

| | | |
|---|---|---|
| EP | 1952467 | 8/2008 |
| GB | 2517186 | 2/2015 |
| JP | 2014120548 | 6/2014 |
| KR | 20090003840 | 1/2009 |
| KR | 20120083084 | 7/2012 |
| KR | 20120092431 | 8/2012 |
| KR | 101517551 | 5/2015 |
| WO | 2006062947 | 6/2006 |
| WO | 2007061945 | 4/2009 |
| WO | 2010056064 | 5/2010 |
| WO | 2010056061 | 8/2010 |
| WO | 2010096035 | 8/2010 |
| WO | 2011016837 | 2/2011 |
| WO | 2011081440 | 7/2011 |
| WO | 2011090863 | 7/2011 |
| WO | 2012029381 | 3/2012 |
| WO | 2012080252 | 6/2012 |
| WO | 2013104723 | 7/2013 |
| WO | 2013121289 | 8/2013 |
| WO | 2013190128 | 12/2013 |
| WO | 2014202796 | 12/2014 |

OTHER PUBLICATIONS

Boukhvalov et al., Chemical functionalization of graphene with defects, Nano Letters, 2008, 8(12), 4373-4379.

Chung et al., Transferable GaN Layers Grown on ZnO-Coated Graphene Lyers for Optoelectronic Devices, Science, 2010, 330, 655-657.

Cohin et al. Growth of Vertical GaAs Nanowires on an Amorphous Substrate via a Fiber-Textured Si Platform, Nano letters 2013, 13, 2743.

Colombo et al., Ga-assisted catalyst-free growth mechanism of GaAs nanowires by molecular beam epitaxy, Phys Rev B, 2008, 77, 155326.

Dheeraj et al., Controlling crystal phases in GaAs nanowires grown by Au-assisted molecular beam epitaxy, Nanotechnology, 2013, 24, 015601.

(56) References Cited

OTHER PUBLICATIONS

Gao et al., Repeated growth and bubbling transfer of graphene with millimetre-size single-crystal grains using platinum, Nat Commun 2012, 3, 699.
Heib et al., Growth mechanisms and optical properties of GaAs-based semiconductor microstructures by selective area epitaxy, Journal of Crystal Growth, 2008, 310, 1049-1056.
Hong et al., Controlled can der Weals Heteroepitaxy of InAs Nanowires on Carbon Honeycomb Lattices, ACS Nano, 2011, 5(9), 7576-7584.
Huh et al., UV/Ozone-Oxidized Large-Scale Graphene Platform with Large Chemical Enhancement in Surface-Enhanced Raman Scattering, ACS Nano, 2011, 5(12), 9799-9806.
Kent et al., Deep ultraviolet emitting polarization induced nanowire light emitting diods with AlxGa(1-x)N active regions, Nanotechnology, 2014, 25, 455201.
Kim et al., Realization of a high mobility dual-gated graphene field-effect transistor with Al2O3 dielectric, Appl. Phys. Lett. 2009, 94, 062107.
Kim et al., Vertically aligned ZnO nanostructures grown on graphene layers, Applied Physics Letters, 2009, 95, 213101-1 through 213101-3.
Kishino et al., Improved Ti-mask selective-area growth (SAG) by rf-plasma-assisted molecular beam epitaxy demonstrating extremely uniform GaN nanocolumn arrays, J. Crystal Growth 2009, 311, 2063-68.
Kneissl, Advances in group III-nitride-based deep UV light-emitting diode technology, Semiconductor Sci and Tech, 2011, 26, 014036.
Mariani et al., Patterned radial GaAs nanopillar solar cells, Nano Letters, 2011, 11, 2490-2494.
Marzouki et al., Structural and optical characterizations of nitrogen doped ZnO nanowires grown by MOCVD, Materials Letters, 2010, 64, 2112-2114.
Mohseni et al., Hybrid GaAs-Nanowire Carbon-Nanotube Flexible Photovoltaics, IEEE Journal of Selected Topics in Quantum Electronics, 201, 17(4), 1070-1077.
Mulyana et al., Reverisble Oxidation of Graphene Through Ultraviolet/Ozone Treatment and Its Nonthermal Reduction through Ultraviolet Irradiation, J Phys Chem C, 2014, 118(47), 27372-27381.
Mulyana et al., Thermal reversibility in electrical characteristics of ultraviolet/ozone-treated graphene, Applied Physics Letters, 2013, 103, 063107.
Munshi et al., Position-Controlled Uniform GaAs Nanowires on Silicon using Nanoimprint Lithography, Nano Letters, 2014, 14, 960-966.
Musolino et al. Compatibility of the selective area growth of GaN nanowires on AlN-buffered Si substrates with the operation of light emitting diodes. Nanotechnology 2015, 26, 085605.
Nevidomskyy et al., Chemically active substitutional nitrogen impurity in carbon nanotubes, Phys Rev Lett, 91, 105502.
Nistor et al., The role of chemistry in graphene doping for carbon-based electronics, ACS Nano, 2011, 5(4), 3096-3103.
Paek et al., MBE-VLS growth of GaAs nanowires on (111)Si substrate, Physica Status Solidi (C), 2008, 5(9), 2740-2742.
Park et al., Inorganic nanostructures grown on graphene layers, Nanoscale, 2011, 3(9), 3522-3533.
Patsha et al., Growth of GaN nanostructures on graphene, Nanoscience, 2011 International Conference on Enginieering and Technology (ICONSET), pp. 553-555.
Peng et al., Control of growth orientation of GaN nanowires, Chemical Physics Letters, 2002, 359, 241-245.
Pierret et al., Generic nanp-imprint process for fabrication of nanowire arrays, Nanotechnology, 21(6), 065305.
Plissard et al., Gold-free growth of GaAs nanowires on silicon: arrays and polytypism, Nanotechnology, 2010, 21, 1-8.
Plissard et al., High yield of self-catalyzed GaAs nanowire arrays grown on silicon via gallium droplet positioning, Nanotechnology, 2011, 22, 275602.
Sun et al., Compounds Semiconductor Nanowire Solar Cells, IEEE Journal of Selected Topics in Quantum Electronics, 2011, 17(4), 1033-1049.
Toko et al. Selective formation of large-grained (100)- or (111)-oriented Si on glass by Al-induced layer exchange. J Appl Phys, 2014, 115, 094301.
Tomioka et al., Control of InAs Nanowire Growth Directions on Si, Nano Letters, 2008, 8(10), 3475-3480.
Wang et al., Growth of Nanowires, Materials Science and Engineering, 2008, 60, 1-51.
Wang et al., Nanocrystal growth on graphene in various degrees of oxidation, Journal of American Chemical Society, 2010, 132, 3270-3271.
Yamaguchi et al., Passivating chemical vapor deposited graphene with metal oxides for transfer and transistor fabrication processes, Appl Phys Lett, 2013, 102, 143505.
Yin et al., Application of CVD graphene as transparent front electrode in Cu(In, Ga)Se2 solar cell, 2014 IEEE 40th Photovoltaic Specialist Conference (PVSC), pp. 1740-1744, XP032660257.
Yoon et al., Vertical epitaxial Co5Ge7 nanowires and nanobelt arrays on a thin graphitic layer for flexible Field Emission Displays, Advanced Materials, 2009, 21, 4979-4982.
Yu et al., Electronic properties of nitrogen-atom-adsorbed graphene nanoribbons with armchair edges, IEEE transactions on Nanotechnology, 2010, 9(2).
Zhao et al, Aluminum nitride nanowire light emitting diodes: Breaking the fundamental bottleneck of deep ultraviolet light sources, Scientific Reports, 2015, 5, 8332.
International Search Report and Written Opinion dated Oct. 19, 2016 in related application PCT/EP2016/066694 (13 pages).
International Search Report and Written Opinion dated Oct. 14, 2016 in related application PCT/EP2016/006696 (11 pages).
International Search Report and Written Opinion dated Jan. 11, 2017 in related application PCT/EP2016/068350 (16 pages).
Notice of Allowance dated Oct. 30, 2018 in U.S. Appl. No. 14/371,621 (9 pages).
Non-final Office Action dated Dec. 31, 2018 in U.S. Appl. No. 15/749,228 (14 pages).
Pela et al. Accurate band gaps of AlGaN, InGaN, and AlINN alloys calcylations based on LDA-1/2 approach, Applied Physics Letters, 2011, 98, 151907.
Pela et al. "Accurate band gaps of AlGaN, InGaN, and AlInN alloys calculations based on LDA-112 approach." Appl Phys Lett, 2011, 98, 151907.
Restriction Requirement dated Sep. 26, 2018 in related U.S. Appl. No. 15/749,228.

* cited by examiner

NANOWIRES OR NANOPYRAMIDS GROWN ON GRAPHITIC SUBSTRATE

This invention concerns the fabrication of a hole patterned mask layer on a thin graphitic layer as a transparent, conductive and flexible substrate for nanowire or nanopyramid arrays preferably grown by a metal organic vapour phase epitaxy (MOVPE) method or molecular beam epitaxy (MBE) method. The graphitic substrate is provided with a seed layer which can be patterned to allow nanowire or nanopyramid growth in a patterned form such as a nanowire or nanopyramid array. Alternatively, the seed layer is itself provided with a masking layer which can be patterned (along with the seed layer) to allow nanowire or nanopyramid growth. The graphitic layer with seed and optionally masking layer on top can be transferred from a substrate onto other support surfaces, which may enhance vertical nanowire or nanopyramid growth.

Over recent years, the interest in semiconductor nanowires has intensified as nanotechnology becomes an important engineering discipline. Nanowires, which are also referred to as nanowhiskers, nanorods, nanopillars, nanocolumns, etc. by some authors, have found important applications in a variety of electrical devices such as sensors, solar cells to LED's.

For the purpose of this application, the term nanowire is to be interpreted as a structure being essentially in one-dimensional form, i.e. is of nanometer dimensions in its width or diameter and its length typically in the range of a few 100 nm to a few μm. Usually, nanowires are considered to have at least two dimensions not greater than 500 nm, such as not greater than 350 nm, especially not greater than 300 nm such as not greater than 200 nm.

Many different types of nanowires exist, including metallic (e.g., Ni, Pt, Au, Ag), semiconducting (e.g., Si, InP, GaN, GaAs, ZnO), and insulating (e.g., $SiO_2$, $TiO_2$) nanowires. The present inventors are primarily concerned with semiconductor nanowires although it is envisaged that the principles outlined in detail below are applicable to all manner of nanowire technology.

Conventionally, semiconductor nanowires have been grown on a substrate identical to the nanowire itself (homoepitaxial growth). Thus, GaAs nanowires are grown on GaAs substrates and so on. This, of course, ensures that there is a lattice match between the crystal structure of the substrate and the crystal structure of the growing nanowire. Both substrate and nanowire can have identical crystal structures. The present invention, however, concerns nanowires grown on graphitic substrates (heteroepitaxial growth).

Graphitic substrates are substrates composed of single or multiple layers of graphene or its derivatives. In its finest form, graphene is a one atomic layer thick sheet of carbon atoms bound together with double electron bonds (called a $sp^2$ bond) arranged in a honeycomb lattice pattern. Graphitic substrates are thin, light, and flexible, yet very strong.

Compared to other existing transparent conductors such as ITO, ZnO/Ag/ZnO, $TiO_2$/Ag/$TiO_2$, graphene has been proven to have superior opto-electrical properties as shown in a recent review article in Nature Photonics 4 (2010) 611.

The growth of nanowires (NWs) on graphene is not new. In WO2012/080252, there is a discussion of the growth of semiconducting nanowires on graphene substrates using MBE. WO2013/104723 concerns improvements on the '252 disclosure in which a graphene top contact is employed on NWs grown on graphene.

For many applications it will be important that the nanowires or nanopyramids can be grown vertically, perpendicular to the substrate surface. Semiconductor nanowires normally grow in the [111] direction (if cubic crystal structure) or the [0001] direction (if hexagonal crystal structure). This means that the substrate surface needs to be (111) or (0001) oriented where the surface atoms of the substrate is arranged in a hexagonal symmetry.

One problem, however, is that nanowires or nanopyramids can grow randomly on a substrate, in any position or in any direction. In order to position the nanowires therefore, it is known to use a mask with a hole array pattern where nanowires are allowed to grow only in the hole-patterned area. The mask can also promote NW growth in a direction perpendicular to the substrate. Typically, a silica layer is applied to a substrate and etched to create holes in a desired pattern. Nanowires then grow only at the location of the holes. In Nano Letters 14 (2014) 960-966, Munshi et al. show GaAs nanowires grown on Si using a silica mask. Other publications such as Journal of Crystal Growth 310 (2008) 1049-56 also describe masked crystal growth. In Nanotechnology 22 (2011) 275602, Plissard et al. describe a nanowire positioning technique based on gallium droplet positioning. Nanowires only grow from the Ga droplets so their positions can be controlled.

The present inventors have realised, however, that the deposition of a conventional silica or silicon nitride mask on a graphitic substrate is problematic. Masks can be made of an inert compound, such as oxides and nitrides. In particular, the hole-patterned mask comprises at least one insulating material such as $SiO_2$, $Si_3N_4$, $HfO_2$, or $Al_2O_3$ e.g. These materials can be deposited on general semiconductor substrates by chemical vapour deposition (CVD), plasma-enhanced CVD (PE-CVD), sputtering, and atomic layer deposition (ALD) in high quality. However, these deposition methods are not readily applicable to graphitic substrates. Deposition of oxides or nitrides materials by CVD always involves the highly reactive oxygen or nitrogen radicals, which can easily damage the carbon bonds in graphene, leading to a serious loss of useful properties such as high electrical conduction. The damage becomes more severe if the radicals are further activated in a plasma form in PE-CVD deposition. This problem is quite similar in sputtering where highly accelerated oxides/nitrides elements in plasma bombards the graphitic surface.

In addition, graphitic substrates are free of dangling bonds on the surface, therefore chemically inert with a hydrophobic nature. This makes it difficult to deposit oxides and nitrides with e.g. $H_2O$-based ALD technique, requiring complicated chemical functionalization of the graphene surface, which again degrades its properties.

The present inventors therefore propose the application of a seed layer on the graphitic substrate before the application of a masking layer or before conversion of the seed layer into an oxide layer and patterning for the positioned growth of NWs or nanopyramids.

The inventors have appreciated that a thin seed layer can be deposited on a graphitic substrate without damaging the surface of that substrate. The thin seed layer also protects the substrate from the deposition of other unwanted materials thereon.

In particular, the seed layer is an inert layer which does not react with graphene. This seed layer can then be oxidised to form an oxide layer or the seed layer can form a support for the deposition of a masking layer. These layers can then be etched to form holes for NW or nanopyramid growth. The overall solution is therefore much less aggressive and leads to fewer defects on the graphene and less risk of extraneous contamination.

The application of a thin seed layer on graphene for high quality oxide deposition is not new. In Appl. Phys. Lett. 94 (2009) 062107, Kim et al. describe the deposition of a thin aluminium layer before depositing aluminium oxide on graphene by ALD. No one before, however, has considered the importance of the seed layer in the context of controlled growth of nanowires or nanopyramids on graphitic substrates.

In addition, the inventors have found that the application of seed and masking layers can be used as a "carbon contamination-free" scaffold for graphene when the transfer of graphene is desired for NW or nanopyramid growth.

Growth of single and multi-layered graphene has been successfully demonstrated on different substrates. Using the Si sublimation at high temperature, graphene can be grown on SiC substrates. The CVD growth of graphene is the well-known technique, where the most popular way is to make use of metal catalysts such as Cu, Ni, Pt, Ru, etc. Recently the growth of graphene on semiconductors such as Ge and Si as well as on insulators such as $SiO_2$ and $Al_2O_3$ has been reported.

The inventors have noted that as-grown graphene with the metal catalyst underneath may not be readily used for NW growth. For example, the use of CVD graphene grown on Cu cannot be used for NW growth as the Cu can cause severe contamination in the grown NWs, caused inter alia in the growth chamber from the evaporation and out-diffusion of Cu at high temperature. CVD grown graphene on metal catalysts usually has local defects and micro- (or nano) cracks where the bottom metal surface is exposed. The exposed metal surface can be highly reactive with semiconductor materials during the NW growth, which can overwhelm and destroy the proper NW growth on graphene surface. Therefore the transfer of CVD grown graphene from the metal catalyst surface to other surfaces may be necessary before NW growth.

Using the seed (and possible mask) layers as the scaffold for graphene transfer has another important merit. The layers can be deposited directly after the CVD growth of graphene, and therefore protect the clean graphene surface from further processing that involves the deposition of polymer-based materials such as e-beam resists for graphene transfer. The direct deposition of polymer-based materials on CVD grown graphene always leaves carbon residues on the surface, which results in carbon contamination during NW growth, degrading the doping control and optical properties of NWs as well as contaminating the growth system. It could also affect the NW growth itself.

So the deposition of seed (and possible mask) layers before depositing polymer-based materials makes it possible to have the graphene surface carbon-contamination free. It can also be beneficial to incorporate the polymer-based material into the hole patterning process. It can be e-beam resist (or nano-imprinting resist) if the hole patterning would be done by e-beam lithography (nano-imprinting). Any carbon residues on the seed or mask layers can be thoroughly cleaned by oxygen plasma treatment and wet chemical etching, which would easily destroy the bare graphene without seed or mask layers.

SUMMARY OF INVENTION

Thus, viewed from one aspect the invention provides a composition of matter comprising:

a graphitic substrate optionally carried on a support;
a seed layer having a thickness of no more than 50 nm deposited directly on top of said substrate, opposite any support; and
an oxide or nitride masking layer directly on top of said seed layer;
wherein a plurality of holes are present through said seed layer and through said masking layer to said graphitic substrate; and wherein
a plurality of nanowires or nanopyramids are grown from said substrate in said holes, said nanowires or nanopyramids comprising at least one semiconducting group III-V compound.

Viewed from another aspect the invention provides a composition of matter comprising:

a graphitic substrate optionally carried on a support;
an oxidised or nitridized seed layer having a thickness of no more than 50 nm present directly on top of said substrate, opposite any support; optionally
an oxide or nitride masking layer directly on top of said oxidised or nitridized seed layer;
wherein a plurality of holes are present through said seed layer and through said masking layer, if present, to said graphitic substrate; and wherein
a plurality of nanowires or nanopyramids are grown from said substrate in said holes, said nanowires or nanopyramids comprising at least one semiconducting group III-V compound.

Viewed from another aspect the invention provides a process comprising:

(I) providing a graphitic substrate on a support and depositing thereon a seed layer having a thickness of no more than 50 nm;
(II) oxidising or nitridizing said seed layer to form a oxidised or nitridized seed layer; optionally
(III) depositing a masking layer on said oxidised or nitridized seed layer, e.g. an oxide or nitride masking layer;
(IV) optionally transferring the graphitic substrate to a different support;
(V) introducing a plurality holes in said oxidised or nitridized seed layer and said masking layer, if present, said holes penetrating to said substrate;
(VI) growing a plurality of semiconducting group III-V nanowires or nanopyramids in the holes, preferably via a molecular beam epitaxy or metal organic vapour phase epitaxy.

Viewed from another aspect the invention provides a process comprising:

(I) providing a graphitic substrate on a support and depositing thereon a seed layer having a thickness of no more than 50 nm;
(II) depositing on said seed layer an oxide or nitride masking layer;
(III) introducing a plurality holes in said seed layer and said masking layer said holes penetrating to said substrate;
(IV) optionally transferring the graphitic substrate to a different support;
(V) growing a plurality of semiconducting group III-V nanowires or nanopyramids in the holes, preferably via a molecular beam epitaxy or metalorganic vapour phase epitaxy.

Viewed from another aspect the invention provides a product obtained by a process as hereinbefore defined.

Optionally, the surface of the graphitic substrate can be chemically/physically modified in the said plurality of holes to enhance the epitaxial growth of nanowires or nanopyramids.

Viewed from another aspect the invention provides a device, such as an electronic device, comprising a composition as hereinbefore defined, e.g. a solar cell, light emitting device or photodetector.

Definitions

By a group III-V compound semiconductor is meant one comprising at least one element from group III and at least one element from group V. There may be more than one element present from each group, e.g. InGaAs, AlGaN (i.e. a ternary compound), AlInGaN (i.e. a quaternary compound) and so on. The term semiconducting nanowire or nanopyramid is meant nanowire or nanopyramid made of semiconducting materials from group III-V elements.

The term nanowire is used herein to describe a solid, wirelike structure of nanometer dimensions. Nanowires preferably have an even diameter throughout the majority of the nanowire, e.g. at least 75% of its length. The term nanowire is intended to cover the use of nanorods, nanopillars, nanocolumns or nanowhiskers some of which may have tapered end structures. The nanowires can be said to be in essentially in one-dimensional form with nanometer dimensions in their width or diameter and their length typically in the range of a few 100 nm to a few μm. Ideally the nanowire diameter is not greater than 500 nm. Ideally the nanowire diameter is between 50 and 500 nm, however, the diameter can exceed few micrometers (called microwires).

Ideally, the diameter at the base of the nanowire and at the top of the nanowire should remain about the same (e.g. within 20% of each other).

The term nanopyramid refers to a solid pyramidal type structure. The term pyramidal is used herein to define a structure with a base whose sides taper to a single point generally above the centre of the base. It will be appreciated that the single vertex point may appear chamferred. The nanopyramids may have multiple faces, such as 3 to 8 faces, or 4 to 7 faces. Thus, the base of the nanopyramids might be a square, pentagonal, hexagonal, heptagonal, octagonal and so on. The pyramid is formed as the faces taper from the base to a central point (forming therefore triangular faces). The triangular faces are normally terminated with (1-101) or (1-102) planes. The triangular side surfaces with (1-101) facets could either converge to a single point at the tip or could form a new facets ((1-102) planes) before converging at the tip. In some cases, the nanopyramids are truncated with its top terminated with {0001} planes. The base itself may comprise a portion of even cross-section before tapering to form a pyramidal structure begins. The thickness of the base may therefore be up to 200 nm, such as 50 nm.

The base of the nanopyramids can be 50 and 500 nm in diameter across its widest point. The height of the nanopyramids may be 200 nm to a few micrometers, such as 400 nm to 1 micrometer in length.

It will be appreciated that the substrate comprises a plurality of nanowires or nanopyramids. This may be called an array of nanowires or nanopyramids.

Graphitic layers for substrates are films composed of single or multiple layers of graphene or its derivatives. The term graphene refers to a planar sheet of $sp^2$-bonded carbon atoms in a honeycomb crystal structure. Derivatives of graphene are those with surface modification. For example, the hydrogen atoms can be attached to the graphene surface to form graphene. Graphene with oxygen atoms attached to the surface along with carbon and hydrogen atoms is called as graphene oxide. The surface modification can be also possible by chemical doping or oxygen/hydrogen or nitrogen plasma treatment.

The term epitaxy comes from the Greek roots epi, meaning "above", and taxis, meaning "in ordered manner". The atomic arrangement of the nanowire or nanopyramid is based on the crystallographic structure of the substrate. It is a term well used in this art. Epitaxial growth means herein the growth on the substrate of a nanowire or nanopyramid that mimics the orientation of the substrate.

Selective area growth (SAG) is the most promising method for growing positioned nanowires or nanopyramids. This method is different from the metal catalyst assisted vapour-liquid-solid (VLS) method, in which metal catalyst act as nucleation sites for the growth of nanowires or nanopyramids. Other catalyst-free methods to grow nanowires or nanopyramids are self-assembly, spontaneous MBE growth and so on, where nanowires or nanopyramids are nucleated in random positions. These methods yield huge fluctuations in the length and diameter of the nanowires and the height and width of nanopyramids. Positioned nanowires or nanopyramids can also be grown by the catalyst-assisted method.

The SAG method or the catalyst-assisted positioned growth method typically requires a mask with nano-hole patterns on the substrate. The nanowires or nanopyramids nucleate in the holes of the patterned mask on the substrate. This yields uniform size and pre-defined position of the nanowires or nanopyramids.

The term mask refers to the mask material that is directly deposited on the seed layer. The mask material should ideally not absorb emitted light (which could be visible, UV-A, UV-B or UV-C) in the case of an LED or not absorb the entering light of interest in the case of a photodetector. The mask should also be electrically non-conductive. The mask could contain one or more than one material, which include $Al_2O_3$, $SiO_2$, $Si_3N_4$, $TiO_2$, $W_2O_3$, and so on. Subsequently, the hole patterns in the mask material can be prepared using electron beam lithography or nanoimprint lithography and dry or wet etching.

Molecular beam epitaxy (MBE) is a method of forming depositions on crystalline substrates. The MBE process is performed by heating a crystalline substrate in a vacuum so as to energize the substrate's lattice structure. Then, an atomic or molecular mass beam(s) is directed onto the substrate's surface. The term element used above is intended to cover application of atoms, molecules or ions of that element. When the directed atoms or molecules arrive at the substrate's surface, the directed atoms or molecules encounter the substrate's energized lattice structure or a catalyst droplet as described in detail below. Over time, the oncoming atoms form a nanowire.

Metalorganic vapour phase epitaxy (MOVPE) also called as metalorganic chemical vapour deposition (MOCVD) is an alternative method to MBE for forming depositions on crystalline substrates. In case of MOVPE, the deposition material is supplied in the form of metalorganic precursors, which on reaching the high temperature substrate decomposes leaving atoms on the substrate surface. In addition, this method requires a carrier gas (typically $H_2$ and/or $N_2$) to transport deposition materials (atoms/molecules) across the substrate surface. These atoms reacting with other atoms form an epitaxial layer on the substrate surface. Choosing the deposition parameters carefully results in the formation of a nanowire.

The graphene transfer process is the process generally used to transfer as-grown graphene from metal catalyst to other supports. The overall process is that, first the polymer-based layer such as e-beam resist and photoresist is deposited on graphene as a scaffold usually by a spin-coating method with a thickness of 0.1~1 μm. Then graphene with polymer layer on top is detached from metal catalyst by either etching away the metal catalyst in wet etching solution or electrochemical delamination in an electrolyte (Nat. Commun. 3 (2012) 699). The graphene with a polymer layer on top, which is now floating in the solution, can be transferred onto desired supports. After the transfer, the polymer layer can be removed by acetone or further processed as resist for e-beam lithography or nano-imprinting lithography.

BRIEF DESCRIPTION OF THE FIGURES

FIG. 2b-2 shows GaN nanorods grown on the resulting substrate using MBE. FIG. 2b-3 shows GaN micro-pyramids grown on the resulting substrate using MOCVD.

DETAILED DESCRIPTION OF INVENTION

Figure 1A:
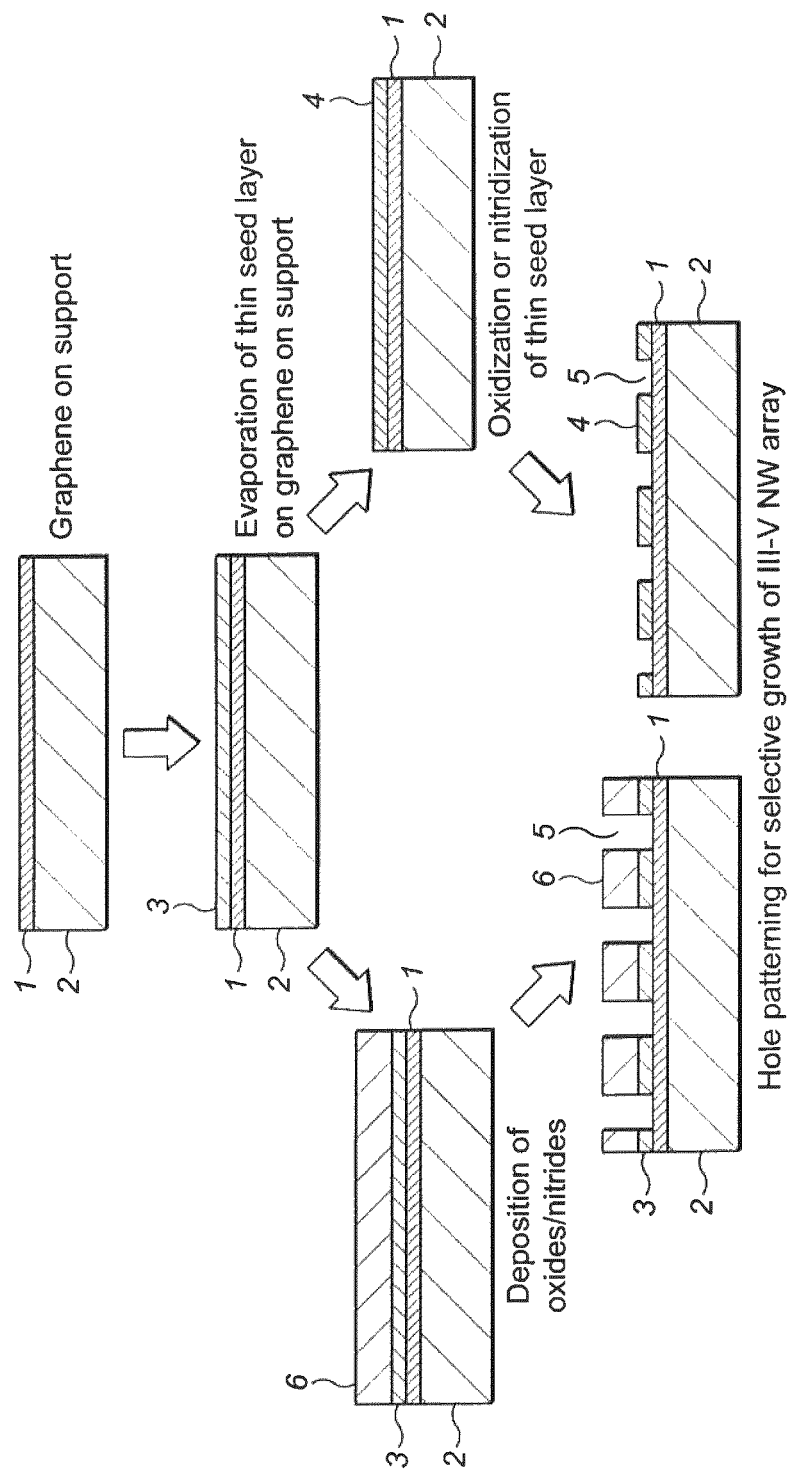
FIG. 1a shows a flow diagram for the manufacture of a composition as claimed herein. Graphene layer 1 is carried on a support 2. A thin seed layer 3 is evaporated onto the graphene layer. In the first embodiment, the seed layer oxidises to form oxidised seed layer 4 and holes 5 are patterned through the oxidised seed layer to the graphitic substrate below. Nanowires are then grown in the holes. In alternative process, a metal oxide or nitride layer 6 is deposited on the seed layer 3, before holes 5 are patterned through both seed and masking layer. Nanowires are then grown in the holes.
Figure 1B:
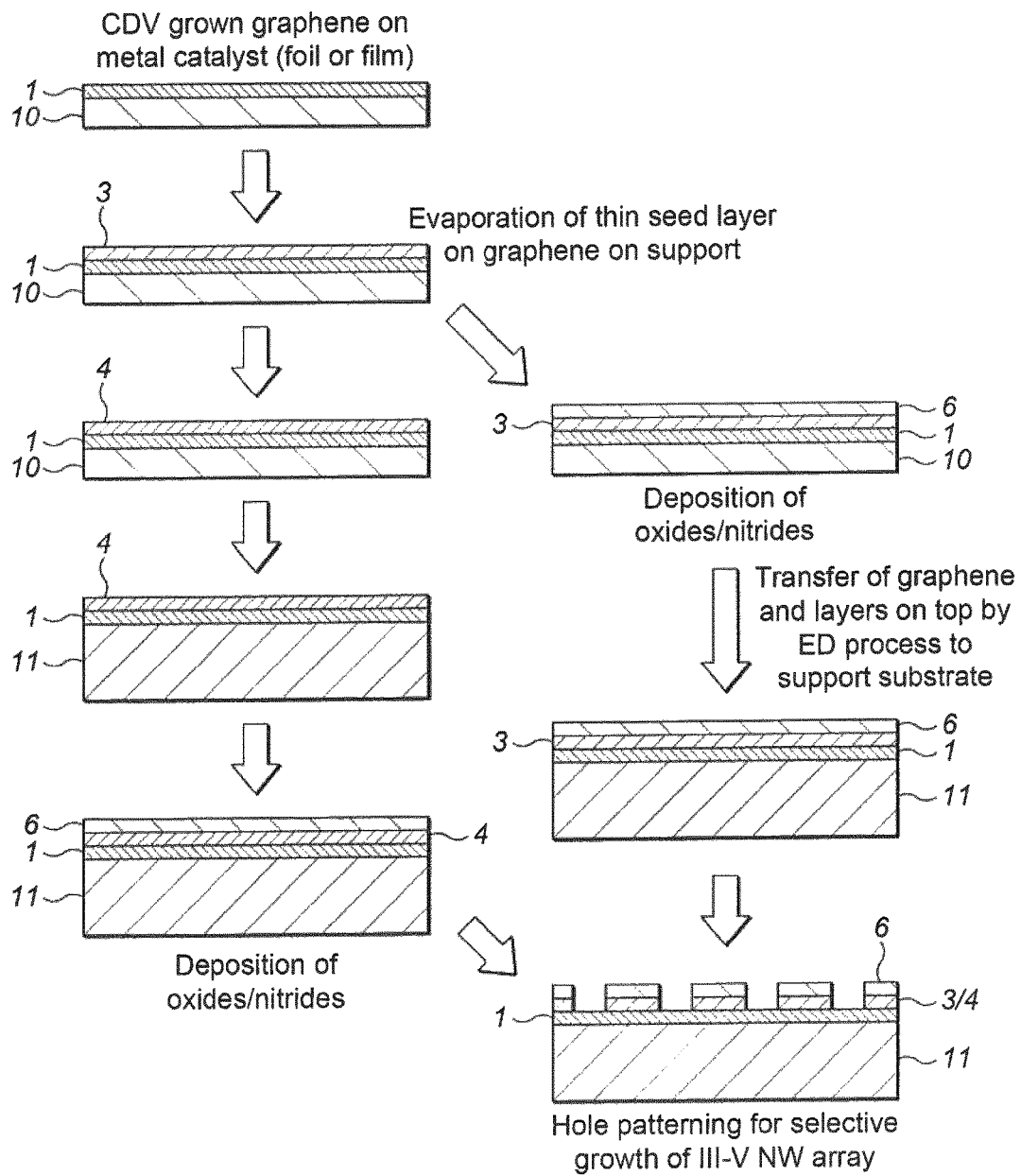
FIG. 1b shows a flow diagram in which a graphene substrate 1 is grown on a metal catalyst layer 10 in the form of a foil or film. A seed layer 3 is then applied to the graphene. This seed layer can be oxidised to layer 4 and/or also a masking layer 6 can be applied. The graphene layer 1 is then removed from metal catalyst layer 10 and transferred to a new substrate 11 by an electrochemical delamination method where an aqueous electrolyte based on acid, hydroxide, carbonate, or chloride solution is employed. There is then the opportunity to deposit a further masking layer 6' before patterning.
Figure 2A:
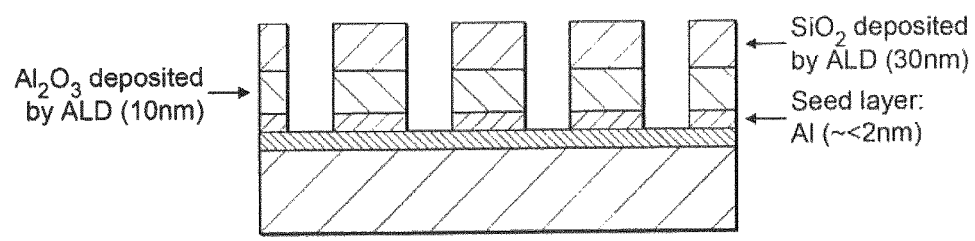
FIG. 2a shows a schematic of a graphitic substrate where hole patterns through an Al seed layer with two masking layers formed from Al oxide and silica.
Figures 1, 2B:
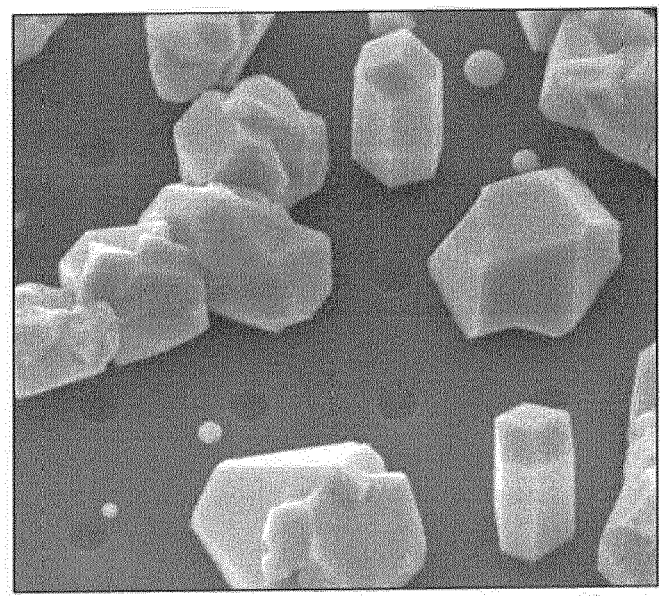
FIG. 2b-1 shows core-shell type GaAs nanowires grown on the resulting substrate using MBE.
Figures 2, 2B:
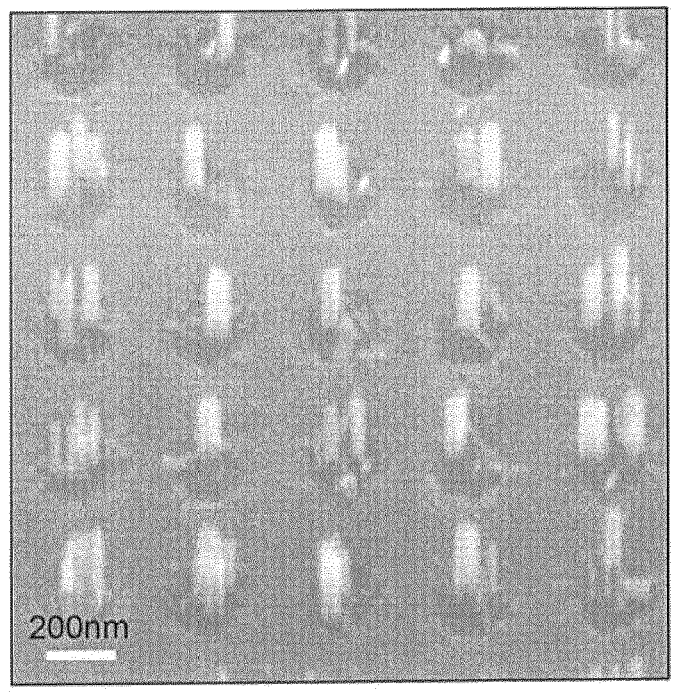
Figures 2, 2B, 3:
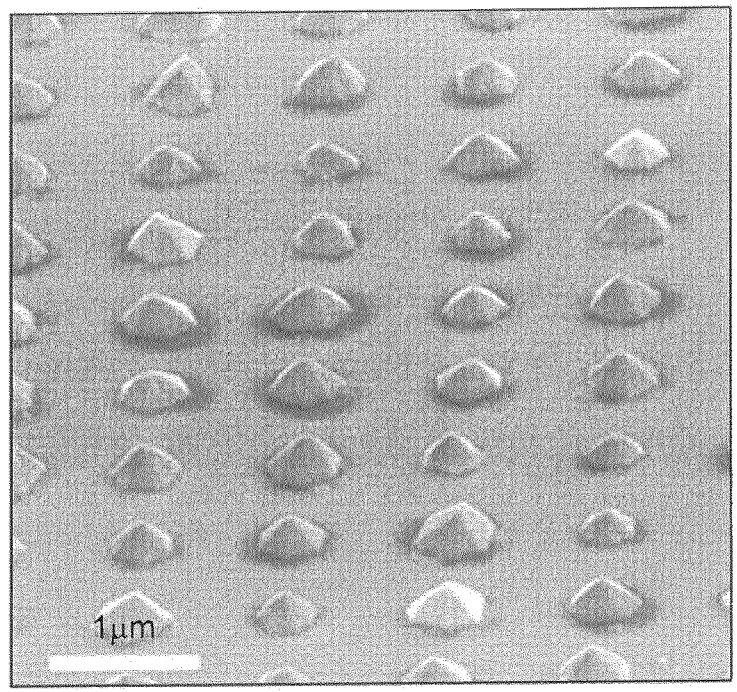
Figure 3A:
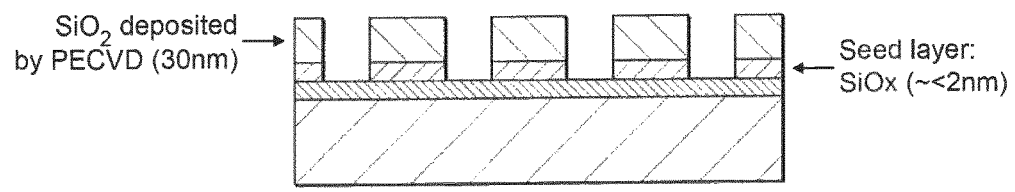
FIG. 3a shows a schematic of a graphitic substrate with a Si seed layer which is oxidised to silica and a silica mask deposited thereon.
Figure 3B:
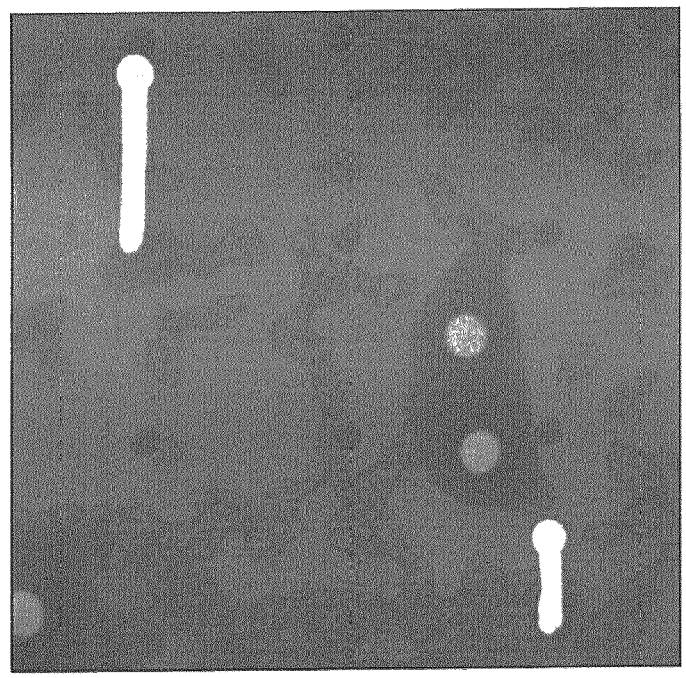
FIG. 3b shows GaAs nanowires grown on the resulting substrate using MBE.
Figure 4A:
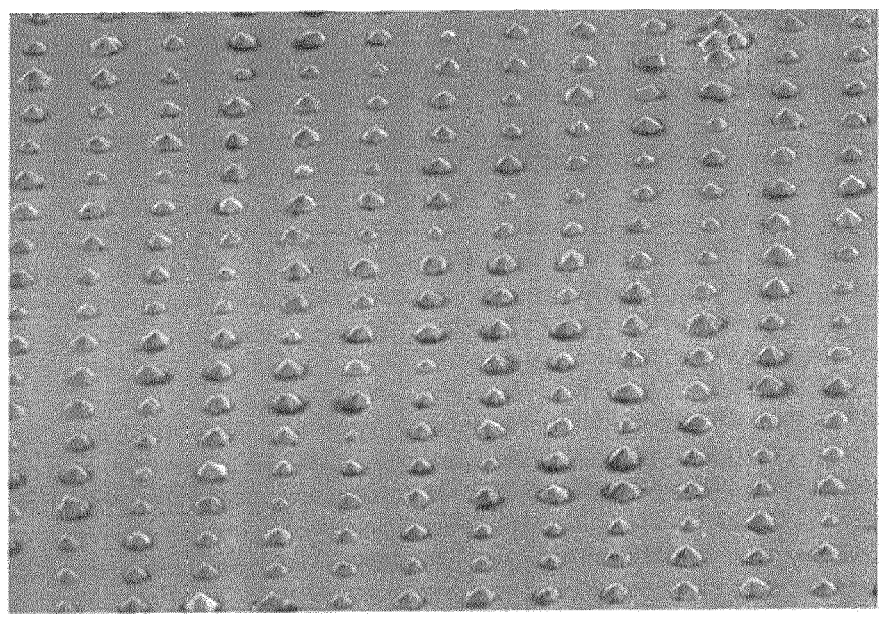
FIG. 4: (a) Low magnification and (b) High magnification tilted view SEM images of GaN nanopyramids grown on patterned single or double layer graphene by MOVPE.
Figure 4B:
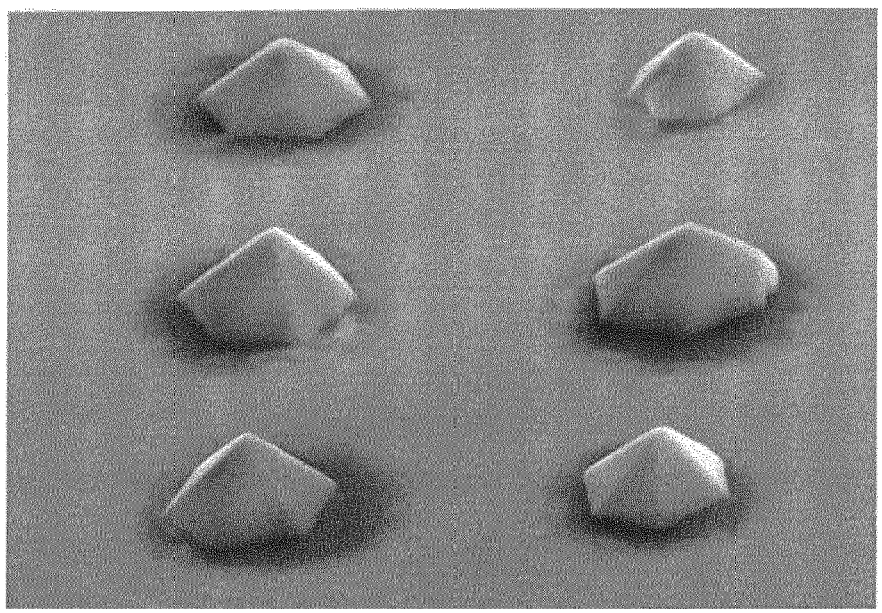

This invention concerns the use of graphitic layers as a substrate for nanowire or nanopyramid growth in combination with a seed layer and optionally a masking layer. Ideally, the graphitic layer is transparent, conductive and flexible. The semiconductor nanowire or nanopyramid array comprises a plurality of nanowires or nanopyramids grown epitaxially from said nanowire or nanopyramid substrate.

Having a nanowire or nanopyramid grown epitaxially provides homogeneity to the formed material which may enhance various end properties, e.g. mechanical, optical or electrical properties.

Epitaxial nanowires or nanopyramids may be grown from gaseous, liquid or solid precursors. Because the substrate acts as a seed crystal, the deposited nanowire or nanopyramid can take on a lattice structure and orientation similar to those of the substrate. Epitaxy is different from other thin-film deposition methods which deposit polycrystalline or amorphous films, even on single-crystal substrates.

Substrate for Nanowire or Nanopyramid Growth

The substrate used to grow nanowires or nanopyramids is a graphitic substrate, more especially it is graphene. As used herein, the term graphene refers to a planar sheet of $sp^2$-bonded carbon atoms that are densely packed in a honeycomb (hexagonal) crystal lattice. This graphitic substrate should preferably be no more than 20 nm in thickness. Ideally, it should contain no more than 10 layers of graphene or its derivatives, preferably no more than 5 layers (which is called as a few-layered graphene). Especially preferably, it is a one-atom-thick planar sheet of graphene.

The crystalline or "flake" form of graphite consists of many graphene sheets stacked together (i.e. more than 10 sheets). By graphitic substrate therefore, is meant one formed from one or a plurality of graphene sheets.

It is preferred if the substrate in general is 20 nm in thickness or less. Graphene sheets stack to form graphite with an interplanar spacing of 0.335 nm. The graphitic substrate preferred comprises only a few such layers and may ideally be less than 10 nm in thickness. Even more preferably, the graphitic substrate may be 5 nm or less in thickness. The area of the substrate in general is not limited. This might be as much as 0.5 mm$^2$ or more, e.g. up to 5 mm$^2$ or more such as up to 10 cm$^2$. The area of the substrate is thus only limited by practicalities.

In a highly preferred embodiment, the substrate is single layer or multi-layer graphene grown on metal catalysts by using a chemical vapour deposition (CVD) method. Metal catalysts can be metallic films or foils made of e.g. Cu, Ni, or Pt. Transfer of the graphene layer grown on these metal catalysts to another substrate can be affected by techniques discussed in detail below. Alternatively, the substrate is a laminated graphite substrate exfoliated from Kish graphite, a single crystal of graphite, or is a highly ordered pyrolytic graphite (HOPG).

Whilst it is preferred if the graphitic substrate is used without modification, the surface of the graphitic substrate can be modified. For example, it can be treated with plasma of hydrogen, oxygen, nitrogen, $NO_2$ or their combinations. Oxidation of the substrate might enhance nanowire or nanopyramid nucleation. It may also be preferable to pretreat the substrate, for example, to ensure purity before nanowire or nanopyramid growth. Treatment with a strong acid such as HF or BOE is an option. Substrates might be washed with iso-propanol, acetone, or n-methyl-2-pyrrolidone to eliminate surface impurities.

The cleaned graphitic surface can be further modified by doping. Dopant atoms or molecules may act as a seed for growing nanowires or nanopyramids. A solution of $FeCl_3$, $AuCl_3$ or $GaCl_3$ could be used in a doping step.

The graphitic layers, more preferably graphene, are well known for their superior optical, electrical, thermal and mechanical properties. They are very thin but very strong, light, flexible, and impermeable. Most importantly in the present invention they are highly electrically and thermally conducting, flexible and transparent. Compared to other transparent conductors such as ITO, ZnO/Ag/ZnO, and $TiO_2/Ag/TiO_2$ which are commercially used now, graphene has been proven to be much more transparent (~98% transmittance in the spectral range of interest from 200 to 2000 nm in wavelength) and conducting (<1000 Ohm/□ sheet resistance for 1 nm thickness).

Support for Substrate

The graphitic substrate may need to be supported in order to allow growth of the nanowires or nanopyramids thereon. The substrate can be supported on any kind of material including conventional semiconductor substrates and transparent glasses.

Conventional semiconductor substrates can be crystalline Si and GaAs with a crystal orientation of [111], [110], or [100] perpendicular to the surface. They can also have oxide or nitride layers such as $SiO_2$, $Si_3N_4$ on top. Some examples of other support substrates include fused silica, fused quartz, silicon carbide, fused alumina or AN. The support should be inert. After nanowire or nanopyramid growth and before use in a device, the support might be removed, e.g. by peeling away the support from the graphitic substrate.

Seed Layer & Masking Layer

The invention requires the application of a thin seed layer on the graphitic substrate. That seed layer may be metallic, semiconducting or insulating. That seed layer is preferably deposited using thermal or e-beam evaporation. Sputtering, CVD or PE-CVD may be possible as long as it does not degrade the graphene surface. For example, a remote plasma technique where the graphene surface does not expose to the direct plasma of seed material having high kinetic energy, but only low-energy, diffused seed material can selectively be deposited with less damage.

The seed layer should be no more than 50 nm in thickness, such as no more than 40 nm, especially no more than 30 nm. The seed layer can in theory be as thin as possible to protect the substrate from damage, such as 1 or 2 nm. It may have a minimum thickness of 1 nm. An especially preferred option is 2 to 20 nm in thickness, which can be easily checked by scanning electron microscopy after deposition.

Semiconducting seed layers of interest are those based on group III-V elements, such as those described below in connection with the nanowires or nanopyramids being grown, as well as group IV elements such as Si and Ge. It is however preferred if the seed layer is formed from a single element. Ideally, that element is a metallic element which term shall include Si in this instance. The metal used to form the metallic seed layer is preferably a transition metal, Al, Si, Ge, Sb, Ta, W, or Nb. B may also be used. Ideally a first row transition metal (e.g. first row transition metal), Si or Al is used. Ideally, it is Al, Si, Cr or Ti. It will be appreciated that there should be no reaction between the seed layer material and the substrate. There is a risk that Al may oxidise the graphene so Al is preferably avoided.

The seed layer may be formed from a plurality of layers if desired, perhaps to ensure ideal adhesion between the graphitic substrate which lies underneath the seed layer and the masking layer which is deposited on top. It may be that the same seed layer material is not ideal for adhering to both these other layers and hence a stack of seed layers might be used.

So whilst a multiple of seed layers could be used, these are still preferably based on a metallic element. Also, it is essential that the total thickness of the seed layer is 50 nm or less.

Once the seed layer has been deposited, there are two options. The seed layer itself can be oxidised or nitridized or a masking layer can be deposited on top of the seed layer.

In the first embodiment, the seed layer is exposed to oxygen or nitrogen to cause oxidation or nitridization of the seed layer to the corresponding oxide or nitride. The oxygen/nitrogen can be supplied as pure gas but more conveniently, it is simply supplied in air. The temperature and pressure of the oxidation process can be controlled to ensure that the seed layer oxidises/nitridizes but not the graphitic layer. Oxygen/nitrogen plasma treatment can be also applied. Preferred oxides are silicon dioxide, titanium dioxide or aluminium oxide.

In the second embodiment an oxide or nitride masking layer, preferably a metal oxide or metal nitride layer or semimetal oxide or semimetal nitride) is deposited on top of the seed layer. This can be achieved through atomic layer deposition or the techniques discussed above in connection with the deposition of the seed layer. The oxide used is preferably based on a metal or semimetal (such as Si). The nature of the cation used in the masking layer may be selected from the same options as the seed layer i.e. Al, Si or a transition metal, especially a first 3d row transition metal (Sc—Zn). The masking layer can therefore be formed from an oxide or a nitride of the seed layer element It is preferred if the metal atom of the seed layer (adjacent the masking layer) is the same as the cation of the masking layer. The masking layer should, however, be formed of a different material to the seed layer.

Preferred masking layers are based on oxides, such as $SiO_2$, $Si_3N_4$, $TiO_2$ or $Al_2O_3$, $W_2O_3$, and so on.

It is within the scope of the invention for a second masking layer to be applied on top of the first masking layer, especially when $Al_2O_3$ is employed as a lower masking layer. Again, the materials used in this layer are oxides or nitrides such as metal oxides or nitrides of transition metals, Al or Si. The use of silica is preferred. It is preferred if the second masking layer is different from the first masking layer. The use of atomic layer deposition is appropriate to apply that second masking layer or the same techniques described with the seed layer deposition can be employed.

Each of the masking layers may be 5 to 100 nm in thickness, such as 10 to 50 nm. There may be a plurality of such layers, such as 2, 3 or 4 masking layers.

The total thickness of seed layer and masking layers may be up to 200 nm such as 30 to 100 nm.

The seed layer and masking layers are preferably continuous and cover the substrate as a whole. This ensures that the layers are defect-free and thus prevents nucleation of nanowires or nanopyramids on the seed/masking layer.

In a further embodiment, a masking layer as hereinbefore defined can be applied to an oxidised or nitridized seed layer as hereinbefore defined. For example a silicon dioxide layer might be applied by PE-CVD onto an oxidised silicon seed layer. Again, the masking layer might be 5 to 100 nm in thickness such as 10 to 50 nm.

The seed layer or masking layer should be smooth and free of defects so that nanowires or nanopyramids cannot nucleate on the seed layer.

Transfer of Graphene With Seed (and/or Masking) Layer

The CVD growth of single and multi-layer graphene using metal catalyst supports such as Cu, Pt, and Ni in foil or film form, is a quite well-matured process. In order to use graphene in device fabrication, it is preferred to transfer graphene by detaching it from the metal catalyst to another support such as one hereinbefore defined. The most common way to do this is to transfer the graphene using a wet etching method where, for example, CVD grown graphene on Cu foil is the base where e-beam resist is first deposited as a scaffold and then immersed in a Cu etchant solution. Then the CVD graphene/e-beam resist layers remain floating in the etching solution and can be transferred to other substrates. However, this method always leaves significant contamination on the transferred graphene from residual Cu which comes from incomplete wet etching of the Cu foil or re-deposition of Cu on graphene during the CVD growth.

Additional contamination would be present as carbon remnants from the e-beam resist scaffold. These can be detrimental in NW or nanopyramid growth, contaminating the NWs or nanopyramids as well as the growth system. With the deposition of a seed layer (or seed and mask layers) on CVD grown graphene before depositing the polymer-based layer scaffold such as e-beam resist, the contamination issue by carbon remnants on the graphene surface can be removed. It is preferable to use the CVD grown graphene on Pt with an electrochemical delamination method for graphene transfer. Pt has a very high melting temperature (T>1500° C.) with a very low vapour pressure ($<10^{-7}$ mmHg) at the graphene growth temperature of ~1000° C. The electrochemical delamination method is a method where graphene is delaminated from the metal catalyst surface by hydrogen bubbles generated at the cathode, which here would be the graphene/Pt stack, by applying a voltage in an electrolyte solution. The anode would be made of Pt as well. It does not involve any etching of Pt. Therefore this would not give any Pt remnants on the grown graphene, which consequently does not raise any contamination issue in NW or nanopyramid growth.

There is also a possibility to make use of the polymer scaffold for subsequent patterning processes. If the polymer scaffold used is an e-beam resist, it can be directly used for the e-beam lithography of hole patterning after the transfer to a support without any other processes except a drying step.

Thus viewed from another aspect the invention provides a process comprising:

(I) providing a graphitic substrate composed of CVD grown single or multi-layer graphene on a metal catalyst layer, such as Pt, and depositing thereon a seed layer having a thickness of no more than 50 nm;

(II) oxidising or nitridizing said seed layer to form an oxidised or nitridized seed layer; optionally (III) depositing a masking layer on said oxidised or nitridized seed layer;

(IV) depositing a polymer layer on said masking layer (if present) or said oxidised seed or nitridized layer, said polymer layer being capable of acting as a scaffold for the transfer of said graphitic substrate to another support;

(V) transferring the graphitic substrate from said metal catalyst layer to another support;

(VI) optionally removing the polymer layer, and optionally depositing a further oxide or nitride masking layer on top of the upper layer present;

(VII) introducing a plurality holes through all layers present penetrating to said graphitic substrate;

(VIII) growing a plurality of semiconducting group III-V nanowires or nanopyramids in the holes, preferably via a molecular beam epitaxy or metalorganic vapour phase epitaxy.

Viewed from another aspect the invention provides a process comprising:

(I) providing a graphitic substrate composed of CVD grown single or multi-layered graphene on a metal catalyst layer, such as Pt, and depositing thereon a seed layer having a thickness of no more than 50 nm;

(II) depositing a masking layer on said seed layer;

(III) depositing a polymer layer on said masking layer said polymer layer being capable of acting as a scaffold for the transfer of said graphitic substrate to another support;

(IV) transferring the graphitic substrate from said metal catalyst layer to a support;

(V) optionally removing the polymer layer, and optionally depositing a further oxide or nitride masking layer on top of the upper layer present;

(VI) introducing a plurality holes through all layers present penetrating to said substrate;

(VII) growing a plurality of semiconducting group III-V nanowires or nanopyramids in the holes, preferably via a molecular beam epitaxy or metalorganic vapour phase epitaxy.

The polymer layer is one that can be used as an e-beam resist and are well known in the art. Suitable polymers include poly(meth)acrylates, copolymer resists composed of copolymers based on methyl methacrylate and methacrylic acid (PMMA/MA), styrene acrylates, Novolak based e-beam resists, epoxy based polymer resins, other acrylate polymers, glutarimide, phenol formaldehyde polymers and etc.

The polymer layer may be 100~2000 nm in thickness.

Patterning

The nanowires or nanopyramids need to grow from the graphitic substrate. That means that holes need to be patterned through all upper layers present such as the seed layer and masking layer(s) if present, to the substrate. Etching of these holes is a well-known process and can be carried out using e-beam lithography or any other known techniques. The hole patterns in the mask can be easily fabricated using conventional photo/e-beam lithography or nanoimprinting. Focused ion beam technology may also be used in order to create a regular array of nucleation sites on the graphitic surface for the nanowire or nanopyramid growth. The holes created in the masking and seed layers can be arranged in any pattern which is desired.

Holes are preferably substantially circular in cross section. The depth of each hole will be the same as the thickness of the seed layers and masking layers. The diameter of the holes is preferably up to 500 nm, such as up to 100 nm, ideally up to 20 to 200 nm. The diameter of the hole sets a maximum diameter for the size of the nanowires or nanopyramids so the hole size and nanowire or nanopyramid diameters should match. However, nanowire or nanopyramid diameter larger than the hole size could be achieved by adopting a core-shell nanowire or nanopyramid geometry.

The number of holes is a function of the area of the substrate and desired nanowire or nanopyramid density.

As the nanowires or nanopyramids begin growing within a hole, this tends to ensure that the initial growth of the nanowires or nanopyramids is substantially perpendicular to the substrate. This is a further preferred feature of the invention. One nanowire or nanopyramid preferably grows per hole.

Growth of Nanowires or Nanopyramids

In order to prepare nanowires or nanopyramids of commercial importance, it is preferred that these grow epitaxially on the substrate. It is also ideal if growth occurs perpendicular to the substrate and ideally therefore in the [111] (for cubic crystal structure) or [0001] (for hexagonal crystal structure) direction.

The present inventors have determined, however, that epitaxial growth on graphitic substrates is possible by determining a possible lattice match between the atoms in the semiconductor nanowire or nanopyramid and the carbon atoms in the graphene sheet.

The carbon-carbon bond length in graphene layers is about 0.142 nm. Graphite has hexagonal crystal geometry. The present inventors have previously realised that graphite can provide a substrate on which semiconductor nanowires or nanopyramids can be grown as the lattice mismatch between the growing nanowire or nanopyramid material and the graphitic substrate can be very low.

The inventors have realised that due to the hexagonal symmetry of the graphitic substrate and the hexagonal symmetry of the semiconductor atoms in the (111) planes of a nanowire or nanopyramid growing in the [111] direction with a cubic crystal structure (or in the (0001) planes of a nanowire or nanopyramid growing in the [0001] direction with a hexagonal crystal structure), a lattice match can be achieved between the growing nanowires or nanopyramids and the substrate. A comprehensive explanation of the science here can be found in WO2013/104723.

Without wishing to be limited by theory, due to the hexagonal symmetry of the carbon atoms in graphitic layers, and the hexagonal symmetry of the atoms of cubic or hexagonal semiconductors in the [111] and [0001] crystal direction, respectively, (a preferred direction for most nanowire or nanopyramid growth), a close lattice match between the graphitic substrate and semiconductor can be achieved when the semiconductor atoms are placed above the carbon atoms of the graphitic substrate, ideally in a hexagonal pattern. This is a new and surprising finding and can enable the epitaxial growth of nanowires or nanopyramids on graphitic substrates.

The different hexagonal arrangements of the semiconductor atoms as described in WO2013/104723, can enable semiconductor nanowires or nanopyramids of such materials to be vertically grown to form free-standing nanowires or nanopyramids on top of a thin carbon-based graphitic material.

In a growing nanopyramid, the triangular faces are normally terminated with (1-101) or (1-102) planes. The triangular side surfaces with (1-101) facets could either converge to a single point at the tip or could form a new facets ((1-102) planes) before converging at the tip. In some cases, the nanopyramids are truncated with its top terminated with {0001} planes.

Whilst it is ideal that there is no lattice mismatch between a growing nanowire or nanopyramid and the substrate, nanowires or nanopyramids can accommodate much more lattice mismatch than thin films for example. The nanowires or nanopyramids of the invention may have a lattice mismatch of up to about 10% with the substrate and epitaxial growth is still possible. Ideally, lattice mismatches should be 7.5% or less, e.g. 5% or less.

For some semiconductors like cubic InAs (a=6.058 Å), cubic GaSb (a=6.093 Å), the lattice mismatch is so small (<~1%) that excellent growth of these semiconductor nanowires or nanopyramids can be expected.

Growth of nanowires/nanopyramids can be controlled through flux ratios. Nanopyramids are encouraged, for example if high group V flux is employed.

The nanowires that are grown can be said to be in essentially in one-dimensional form with nanometer dimensions in their width or diameter and their length typically in the range of a few 100 nm to a few µm. Ideally the nanowire diameter is not greater than 500 nm. Ideally the nanowire diameter is between 50 and 500 nm; however, the diameter can exceed few micrometers (called microwires).

The nanowire grown in the present invention may therefore be from 250 nm to several micrometers in length, e.g. up to 5 micrometers. Preferably the nanowires are at least 1 micrometer in length. Where a plurality of nanowires are grown, it is preferred if they all meet these dimension requirements. Ideally, at least 90% of the nanowires grown on a substrate will be at least 1 micrometer in length. Preferably substantially all the nanowires will be at least 1 micrometer in length.

Nanopyramids may be 250 nm to 1 micrometer in height, such as 400 to 800 nm in height, such as about 500 nm.

Moreover, it will be preferred if the nanowires or nanopyramids grown have the same dimensions, e.g. to within 10% of each other. Thus, at least 90% (preferably substantially all) of the nanowires or nanopyramids on a substrate will preferably be of the same diameter and/or the same length (i.e. to within 10% of the diameter/length of each other). Essentially, therefore the skilled man is looking for homogeneity and nanowires or nanopyramids that are substantially the same in terms of dimensions.

The length of the nanowires or nanopyramids is often controlled by the length of time for which the growing process runs. A longer process typically leads to a (much) longer nanowire.

The nanowires or nanopyramids have typically a hexagonal cross sectional shape. The nanowire may have a cross sectional diameter of 25 nm to several micrometers (i.e. its thickness). As noted above, the diameter is ideally constant throughout the majority of the nanowire. Nanowire diameter can be controlled by the manipulation of the substrate temperature and/or the ratio of the atoms used to make the nanowire as described further below.

Moreover, the length and diameter of the nanowires or nanopyramids can be affected by the temperature at which they are formed. Higher temperatures encourage high aspect ratios (i.e. longer and/or thinner nanowires). The skilled man is able to manipulate the growing process to design nanowires or nanopyramids of desired dimensions.

The nanowires or nanopyramids of the invention are formed from at least one III-V compound. Group III options are B, Al, Ga, In, and Tl. Preferred options here are Ga, Al and In.

Group V options are N, P, As, Sb. All are preferred.

It is of course possible to use more than one element from group III and/or more than one element from group V. Preferred compounds for nanowire or nanopyramid manufacture include AlAs, GaSb, GaP, GaN, AN, AlGaN, AlGaInN, GaAs, InP, InN, InGaAs, InSb, InAs, or AlGaAs. Compounds based on Al, Ga and In in combination with N are one option. The use of GaN, AlGaN, AlInGaN or AN is highly preferred.

It is most preferred if the nanowires or nanopyramids consist of Ga, Al, In and N (along with any doping atoms as discussed below).

Whilst the use of binary materials is possible, the use of ternary nanowires or nanopyramids in which there are two group III cations with a group V anion are preferred here, such as AlGaN. The ternary compounds may therefore be of formula XYZ wherein X is a group III element, Y is a group III different from X, and Z is a group V element. The X to Y molar ratio in XYZ is preferably 0.1 to 0.9, i.e. the formula is preferably $X_xY_{1-x}Z$ where subscript x is 0.1 to 0.9.

Quaternary systems might also be used and may be represented by the formula $A_xB_{1-x}C_yD_{1-y}$ where A and B are group III elements and C and D are group V elements. Again subscripts x and y are typically 0.1 to 0.9. Other options will be clear to the skilled man.

Doping

The nanowires or nanopyramids of the invention can contain a p-n or p-i-n junction, e.g. to enable their use in LEDs. NWs or nanopyramids of the invention are therefore optionally provided with an undoped intrinsic semiconductor region between a p-type semiconductor and an n-type semiconductor region.

It is therefore essential that the nanowires or nanopyramids are doped. Doping typically involves the introduction of impurity ions into the nanowire, e.g. during MBE or MOVPE growth. The doping level can be controlled from $10^{15}/cm^3$ to $10^{20}/cm^3$. The nanowires or nanopyramids can be p-type doped or n-type doped as desired. Doped semiconductors are extrinsic semiconductors.

The n(p)-type semiconductors have a larger electron (hole) concentration than hole (electron) concentration by doping an intrinsic semiconductor with donor (acceptor) impurities. Suitable donor (acceptors) for III-V compounds can be Te, Sn (Be, Mg and Zn). Si can be amphoteric, either donor or acceptor depending on the site where Si goes to, depending on the orientation of the growing surface and the growth conditions. Dopants can be introduced during the growth process or by ion implantation of the nanowires or nanopyramids after their formation.

Higher carrier injection efficiency is required to obtain higher external quantum efficiency (EQE) of LEDs. However, the increasing ionization energy of Mg acceptors with increasing Al content in AlGaN alloys makes it difficult to obtain higher hole concentration in AlGaN alloys with higher Al content. To obtain higher hole injection efficiency (especially in the cladding/barrier layers consisting of high Al content), the inventors have devised a number of strategies which can be used individually or together.

There are problems to overcome in the doping process therefore. It is preferred if the nanowires or nanopyramids of the invention comprise Al. The use of Al is advantageous as high Al content leads to high band gaps, enabling UV-C LED emission from the active layer(s) of nanowires or nanopyramids and/or avoiding absorption of the emitted light in the doped cladding/barrier layers. Where the band gap is high, it is less likely that UV light is absorbed by this part of the nanowires or nanopyramids. The use therefore of AlN or AlGaN in nanowires or nanopyramids is preferred.

However, p-type doping of AlGaN or AlN to achieve high electrical conductivity (high hole concentration) is challenging as the ionization energy of Mg or Be acceptors increases with increasing Al content in AlGaN alloys. The present inventors propose various solutions to maximise electrical conductivity (i.e. maximise hole concentration) in AlGaN alloys with higher average Al content.

Where the nanowires or nanopyramids comprise AlN or AlGaN, achieving high electrical conductivity by introducing p-type dopants is a challenge. One solution relies on a short period superlattice (SPSL). In this method, we grow a superlattice structure consisting of alternating layers with different Al content instead of a homogeneous AlGaN layer with higher Al composition. For example, the cladding layer with 35% Al content could be replaced with a 1.8 to 2.0 nm thick SPSL consisting of, for example, alternating $Al_xGa_{1-x}N:Mg/Al_yGa_{1-y}N:Mg$ with $x=0.30/y=0.40$. The low ionization energy of acceptors in layers with lower Al composition leads to improved hole injection efficiency without compromising on the barrier height in the cladding layer. This effect is additionally enhanced by the polarization fields at the interfaces. The SPSL can be followed with a highly p-doped GaN:Mg layer for better hole injection.

More generally, the inventors propose to introduce a p-type doped $Al_xGa_{1-x}N/Al_yGa_{1-y}N$ short period superlattice (i.e. alternating thin layers of $Al_xGa_{1-x}N$ and $Al_yGa_{1-y}N$) into the nanowires or nanopyramid structure, where the Al mole fraction x is less than y, instead of a p-type doped $Al_zGa_{1-z}N$ alloy where $x<z<y$. It is appreciated that x could be as low as 0 (i.e. GaN) and y could be as high as 1 (i.e. AlN). The superlattice period should preferably be 5 nm or less, such as 2 nm, in which case the superlattice will act as a single $Al_zGa_{1-z}N$ alloy (with z being a layer thickness weighted average of x and y) but with a higher electrical conductivity than that of the $Al_zGa_{1-z}N$ alloy, due to the higher p-type doping efficiency for the lower Al content $Al_xGa_{1-x}N$ layers.

In the nanowires or nanopyramids comprising a p-type doped superlattice, it is preferred if the p-type dopant is an alkali earth metal such as Mg or Be.

A further option to solve the problem of doping an Al containing nanowire/nanopyramid follows similar principles. Instead of a superlattice containing thin AlGaN layers with low or no Al content, a nanostructure can be designed containing a gradient of Al content (mole fraction) in the growth direction of the AlGaN within the nanowires or nanopyramids. Thus, as the nanowires or nanopyramids grow, the Al content is reduced/increased and then increased/reduced again to create an Al content gradient within the nanowires or nanopyramids.

This may be called polarization doping. In one method, the layers are graded either from GaN to AlN or AlN to GaN. The graded region from GaN to AlN and AlN to GaN may lead to n-type and p-type conduction, respectively. This can happen due to the presence of dipoles with different magnitude compared to its neighbouring dipoles. The GaN to AlN and AlN to GaN graded regions can be additionally doped with n-type dopant and p-type dopant respectively.

In a preferred embodiment, p-type doping is used in AlGaN nanowires using Be as a dopant.

Thus, one option would be to start with a GaN nanowire/nanopyramid and increase Al and decrease Ga content gradually to form AlN, perhaps over a growth thickness of 100 nm. This graded region could act as a p- or n-type region, depending on the crystal plane, polarity and whether the Al content is decreasing or increasing in the graded region, respectively. Then the opposite process is effected to produce GaN once more to create an n- or p-type region (opposite to that previously prepared). These graded regions could be additionally doped with n-type dopants such as Si and p-type dopants such as Mg or Be to obtain n- or p-type regions with high charge carrier density, respectively. The crystal planes and polarity is governed by the type of nanowire/nanopyramid as is known in the art.

Viewed from another aspect therefore, the nanowires or nanopyramids of the invention comprise Al, Ga and N atoms wherein during the growth of the nanowires or nanopyramids the concentration of Al is varied to create an Al concentration gradient within the nanowires or nanopyramids.

In a third embodiment, the problem of doping in an Al containing nanowire or nanopyramid is addressed using a tunnel junction. A tunnel junction is a barrier, such as a thin layer, between two electrically conducting materials. In the context of the present invention, the barrier functions as an ohmic electrical contact in the middle of a semiconductor device.

In one method, a thin electron blocking layer is inserted immediately after the active region, which is followed by a p-type doped AlGaN cladding layer with Al content higher than the Al content used in the active layers. The p-type doped cladding layer is followed by a highly p-type doped cladding layer and a very thin tunnel junction layer followed by an n-type doped AlGaN layer. The tunnel junction layer is chosen such that the electrons tunnel from the valence band in p-AlGaN to the conduction band in the n-AlGaN, creating holes that are injected into the p-AlGaN layer.

More generally, it is preferred if the nanowire or nanopyramid comprises two regions of doped GaN (one p- and one n-doped region) separated by an Al layer, such as a very thin Al layer. The Al layer might be a few nm thick such as 1 to 10 nm in thickness. It is appreciated that there are other optional materials that can serve as a tunnel junction which includes highly doped InGaN layers.

It is particularly surprising that doped GaN layers can be grown on the Al layer.

In one embodiment therefore, the invention provides a nanowire or nanopyramid having a p-type doped (Al)GaN region and an n-type doped (Al)GaN region separated by an Al layer.

The nanowires or nanopyramids of the invention can be grown to have a heterostructured form radially or axially. For example for an axial heterostructured nanowire or nanopyramid, p-n junction can be axially formed by growing a p-type doped core first, and then continue with an n-doped core (or vice versa). For a radially heterostructured nanowire or nanopyramid, p-n junction can be radially formed by growing the p-type doped nanowire or nanopyramid core first, and then the n-type doped semiconducting shell is grown (or vice versa)—a core shell nanowire. An intrinsic shell can be positioned between doped regions for a p-i-n nanowire. The NWs or nanopyramids are grown axially or radially and are therefore formed from a first section and a second section. The two sections are doped differently to generate a p-n junction or p-i-n junction. The first or second section of the NW or nanopyramid is the p-type doped or n-type doped section.

The nanowires or nanopyramids of the invention preferably grow epitaxially. They attach to the underlying substrate through covalent, ionic or quasi van der Waals binding. Accordingly, at the junction of the substrate and the base of the nanowire, crystal planes are formed epitaxially within the nanowire. These build up, one upon another, in the same crystallographic direction thus allowing the epitaxial growth of the nanowire. Preferably the nanowires or nanopyramids grow vertically. The term vertically here is used to imply that the nanowires or nanopyramids grow perpendicular to the support. It will be appreciated that in experimental science the growth angle may not be exactly 90° but the term vertically implies that the nanowires or nanopyramids are within about 10° of vertical/perpendicular, e.g. within 5°. Because of the epitaxial growth via covalent, ionic or quasi van der Waals bonding, it is expected that there will be an intimate contact between the nanowires or nanopyramids and the substrate. To enhance the electrical contact property further, the substrate, can be doped to match the major carriers of grown nanowires or nanopyramids.

Because nanowires or nanopyramids are epitaxially grown involving physical and chemical bonding to substrates at high temperature, the bottom contact is preferably ohmic.

It will be appreciated that the substrate comprises a plurality of nanowires or nanopyramids. Preferably the nanowires or nanopyramids grow about parallel to each other. It is preferred therefore if at least 90%, e.g. at least 95%, preferably substantially all nanowires or nanopyramids grow in the same direction from the same plane of the substrate.

It will be appreciated that there are many planes within a substrate from which epitaxial growth could occur. It is preferred if substantially all nanowires or nanopyramids grow from the same plane. It is preferred if that plane is parallel to the substrate surface. Ideally the grown nanowires or nanopyramids are substantially parallel. Preferably, the nanowires or nanopyramids grow substantially perpendicular to the substrate.

The nanowires of the invention should preferably grow in the [111] direction for nanowires or nanopyramids with cubic crystal structure and [0001] direction for nanowires or nanopyramids with hexagonal crystal structure. If the crystal structure of the growing nanowire or nanopyramid is cubic, then the (111) interface between the nanowire or nanopyramid and the graphitic substrate represents the plane from which axial growth takes place. If the nanowire or nanopyramid has a hexagonal crystal structure, then the (0001) interface between the nanowire or nanopyramid and the graphitic substrate represents the plane from which axial growth takes place. Planes (111) and (0001) both represent the same (hexagonal) plane of the nanowire, it is just that the nomenclature of the plane varies depending on the crystal structure of the growing nanowire.

The nanowires or nanopyramids are preferably grown by MBE or MOVPE. In the MBE method, the substrate is provided with a molecular beam of each reactant, e.g. a group III element and a group V element preferably supplied simultaneously. A higher degree of control of the nucleation and growth of the nanowires or nanopyramids on the graphitic substrate might be achieved with the MBE technique by using migration-enhanced epitaxy (MEE) or atomic-layer MBE (ALMBE) where e.g. the group III and V elements can be supplied alternatively.

A preferred technique is solid-source MBE, in which very pure elements such as gallium and arsenic are heated in separate effusion cells, until they begin to slowly evaporate (e.g. gallium) or sublimate (e.g. arsenic). The gaseous elements then condense on the substrate, where they may react with each other. In the example of gallium and arsenic, single-crystal GaAs is formed. The use of the term "beam" implies that evaporated atoms (e.g. gallium) or molecules (e.g. $As_4$ or $As_2$) do not interact with each other or vacuum chamber gases until they reach the substrate.

MBE takes place in ultra-high vacuum, with a background pressure of typically around $10^{-10}$ to $10^{-9}$ Torr. Nanostructures are typically grown slowly, such as at a speed of up to a few, such as about 10, μm per hour. This allows nanowires or nanopyramids to grow epitaxially and maximises structural performance.

In the MOVPE method, the substrate is kept in a reactor in which the substrate is provided with a carrier gas and a metal organic gas of each reactant, e.g. a metal organic precursor containing a group III element and a metal organic precursor containing a group V element preferably supplied simultaneously. The typical carrier gases are hydrogen, nitrogen or a mixture of the two. A higher degree of control of the nucleation and growth of the nanowires or nanopyramids on the graphitic substrate might be achieved with the MOVPE technique by using pulsed layer growth technique, where e.g. the group III and V elements can be supplied alternatively.

Selective Area Growth of Nanowires or Nanopyramids

The nanowires or nanopyramids of the invention may be grown by selective area growth (SAG) method, e.g. in the case of III-nitride nanowire. Inside the growth chamber, the graphitic substrate temperature can then be set to a temperature suitable for the growth of the nanowire or nanopyramid in question. The growth temperature may be in the range 300 to 1000° C. The temperature employed is, however, specific to the nature of the material in the nanowire. For GaN, a preferred temperature is 700 to 950° C., e.g. 800 to 900° C., such as 810° C. For AlGaN the range is slightly higher, for example 800 to 980° C., such as 830 to 950° C., e.g. 850° C.

It will be appreciated therefore that the nanowires or nanopyramids can comprise different group III-V semiconductors within the nanowire, e.g. starting with a GaN stem followed by an AlGaN component or AlGaInN component and so on.

Nanowire growth can be initiated by opening the shutter of the Ga effusion cell, the nitrogen plasma cell, and the dopant cell simultaneously initiating the growth of doped GaN nanowires or nanopyramids, hereby called as stem. The length of the GaN stem can be kept between 10 nm to several 100s of nanometers. Subsequently, one could increase the substrate temperature if needed, and open the Al shutter to initiate the growth of AlGaN nanowires or nanopyramids. One could initiate the growth of AlGaN nanowires or nanopyramids on graphitic layers without the growth of GaN stem. n- and p-doped nanowires or nanopyramids can be obtained by opening the shutter of the n-dopant cell and p-dopant cell, respectively, during the nanowire or nanopyramid growth. For ex: Si dopant cell for n-doping of nanowires or nanopyramids, and Mg dopant cell for p-doping of nanowires or nanopyramids.

The temperature of the effusion cells can be used to control growth rate. Convenient growth rates, as measured during conventional planar (layer by layer) growth, are 0.05 to 2 µm per hour, e.g. 0.1 µm per hour. The ratio of Al/Ga can be varied by changing the temperature of the effusion cells.

The pressure of the molecular beams can also be adjusted depending on the nature of the nanowire or nanopyramid being grown. Suitable levels for beam equivalent pressures are between $1 \times 10^{-7}$ and $1 \times 10^{-4}$ Torr.

The beam flux ratio between reactants (e.g. group III atoms and group V molecules) can be varied, the preferred flux ratio being dependent on other growth parameters and on the nature of the nanowire or nanopyramid being grown. In the case of nitrides, nanowires or nanopyramids are always grown under nitrogen rich conditions.

It is an embodiment of the invention to employ a multistep, such as two step, growth procedure, e.g. to separately optimize the nanowire or nanopyramid nucleation and nanowire or nanopyramid growth.

A significant benefit of MOVPE is that the nanowires or nanopyramids can be grown at a much faster growth rate. This method favours the growth of radial heterostructure nanowires or nanopyramids and microwires, for example: n-doped GaN core with shell consisting of intrinsic AlN/Al(In)GaN multiple quantum wells (MQW), AlGaN electron blocking layer (EBL), and p-doped (Al)GaN shell. This method also allows the growth of axial heterostructured nanowire or nanopyramid using techniques such as pulsed growth technique or continuous growth mode with modified growth parameters for e.g., lower VIII molar ratio and higher substrate temperature.

In more detail, the reactor must be evacuated after placing the sample, and is purged with $N_2$ to remove oxygen and water in the reactor. This is to avoid any damage to the graphene at the growth temperatures, and to avoid unwanted reactions of oxygen and water with the precursors. The total pressure is set to be between 50 and 400 Torr. After purging the reactor with $N_2$, the substrate is thermally cleaned under $H_2$ atmosphere at a substrate temperature of about 1200° C. The substrate temperature can then be set to a temperature suitable for the growth of the nanowire or nanopyramid in question. The growth temperature may be in the range 700 to 1200° C. The temperature employed is, however, specific to the nature of the material in the nanowire. For GaN, a preferred temperature is 800 to 1150° C., e.g. 900 to 1100° C., such as 1100° C. For AlGaN the range is slightly higher, for example 900 to 1250° C., such as 1050 to 1250° C., e.g. 1250° C.

The metal organic precursors for the nanowire or nanopyramid growth can be either trimethylgallium (TMGa), or triethylgallium (TEGa) for Ga, trimethylalumnium (TMAl) or triethylalumnium (TEAl) for Al, and trimethylindium (TMIn) or triethylindium (TEIn) for In. The precursors for dopants can be $SiH_4$ for silicon and bis(cyclopentadienyl)magnesium ($Cp_2Mg$) or bis(methylcyclopentadienyl)magnesium (($MeCp)_2Mg$) for Mg. The flow rate of TMGa, TMAl and TMIn can be maintained between 5 and 100 sccm. The $NH_3$ flow rate can be varied between 5 and 150 sccm.

In particular, the simple use of vapour-solid growth may enable nanowire or nanopyramid growth. Thus, in the context of MBE, simple application of the reactants, e.g. In and N, to the substrate without any catalyst can result in the formation of a nanowire. This forms a further aspect of the invention which therefore provides the direct growth of a semiconductor nanowire or nanopyramid formed from the elements described above on a graphitic substrate. The term direct implies therefore the absence of a film of catalyst to enable growth.

Catalyst-Assisted Growth of Nanowires or Nanopyramids

The nanowires or nanopyramids of the invention may also be grown in the presence of a catalyst. A catalyst can be introduced into those holes to provide nucleating sites for nanowire or nanopyramid growth. The catalyst can be one of the elements making up the nanowire or nanopyramid so-called self-catalysed, or different from any of the elements making up the nanowire.

For catalyst-assisted growth the catalyst may be Au or Ag or the catalyst may be a metal from the group used in the nanowire or nanopyramid growth (e.g. group III metal), especially one of the metal elements making up the actual nanowire or nanopyramid (self-catalysis). It is thus possible to use another element from group III as a catalyst for growing a III-V nanowire or nanopyramid e.g. use Ga as a catalyst for a Ga-group V nanowire or nanopyramid and so on. Preferably the catalyst is Au or the growth is self-catalysed (i.e. Ga for a Ga-group V nanowire or nanopyramid and so on). The catalyst can be deposited onto the substrate in the holes patterned through the seed layer/masking layer to act as a nucleation site for the growth of the nanowires or nanopyramids. Ideally, this can be achieved by providing a thin film of catalytic material formed over the seed layer or masking layer after holes have been etched in the layers. When the catalyst film is melted as the temperature increases to the NW or nanopyramid growth temperature, the catalyst forms nanometer sized particle-like droplets on the substrate and these droplets form the points where nanowires or nanopyramids can grow.

This is called vapour-liquid-solid growth (VLS) as the catalyst is the liquid, the molecular beam is the vapour and the nanowire or nanopyramid provides the solid component. In some cases the catalyst particle can also be solid during the nanowire or nanopyramid growth, by a so called vapour-solid-solid growth (VSS) mechanism. As the nanowire or nanopyramid grows (by the VLS method), the liquid (e.g. gold) droplet stays on the top of the nanowire. It remains at the top of the nanowire or nanopyramid after growth and may therefore play a major role in contacting a top electrode.

As noted above, it is also possible to prepare self-catalysed nanowires or nanopyramids. By self-catalysed is meant that one of the components of the nanowire or nanopyramid acts as a catalyst for its growth.

For example, a Ga layer can be applied to the seed/masking layer, melted to form droplets acting as nucleation sites for the growth of Ga containing nanowires or nanopyramids. Again, a Ga metal portion may end up positioned on the top of the nanowire.

In more detail, a Ga/In flux can be supplied to the substrate surface for a period of time to initiate the formation of Ga/In droplets on the surface upon heating of the substrate. The substrate temperature can then be set to a temperature suitable for the growth of the nanowire or nanopyramid in question. The growth temperature may be in the range 300 to 700° C. The temperature employed is, however, specific to the nature of the material in the nanowire, the catalyst material and the substrate material. For GaAs, a preferred temperature is 540 to 630° C., e.g. 590 to 630° C., such as 610° C. For InAs the range is lower, for example 420 to 540° C., such as 430 to 540° C., e.g. 450° C.

Nanowire growth can be initiated by opening the shutter of the Ga/In effusion cell and the counter ion effusion cell, simultaneously once a catalyst film has been deposited and melted.

The temperature of the effusion cells can be used to control growth rate. Convenient growth rates, as measured during conventional planar (layer by layer) growth, are 0.05 to 2 μm per hour, e.g. 0.1 μm per hour.

The pressure of the molecular beams can also be adjusted depending on the nature of the nanowire or nanopyramid being grown. Suitable levels for beam equivalent pressures are between $1 \times 10^{-7}$ and $1 \times 10^{-5}$ Torr.

The beam flux ratio between reactants (e.g. group III atoms and group V molecules) can be varied, the preferred flux ratio being dependent on other growth parameters and on the nature of the nanowire or nanopyramid being grown.

It has been found that the beam flux ratio between reactants can affect crystal structure of the nanowire. For example, using Au as a catalyst, growth of GaAs nanowires or nanopyramids with a growth temperature of 540° C., a Ga flux equivalent to a planar (layer by layer) growth rate of 0.6 μm per hour, and a beam equivalent pressure (BEP) of $9 \times 10^{-6}$ Torr for $As_4$ produces wurtzite crystal structure. As opposed to this, growth of GaAs nanowires or nanopyramids at the same growth temperature, but with a Ga flux equivalent to a planar growth rate of 0.9 μm per hour and a BEP of $4 \times 10^{-6}$ Torr for $As_4$, produces zinc blende crystal structure.

Nanowire diameter can in some cases be varied by changing the growth parameters. For example, when growing self-catalyzed GaAs nanowires or nanopyramids under conditions where the axial nanowire or nanopyramid growth rate is determined by the $As_4$ flux, the nanowire or nanopyramid diameter can be increased/decreased by increasing/decreasing the Ga:$As_4$ flux ratio. The skilled man is therefore able to manipulate the nanowire or nanopyramid in a number of ways. Moreover, the diameter could also be varied by growing a shell around the nanowire or nanopyramid core, making a core-shell geometry.

It is thus an embodiment of the invention to employ a multistep, such as two step, growth procedure, e.g. to separately optimize the nanowire or nanopyramid nucleation and nanowire or nanopyramid growth.

Moreover, the size of the holes can be controlled to ensure that only one nanowire or nanopyramid can grow in each hole. It is therefore preferred if only one nanowire or nanopyramid grows per hole in the mask. Finally, the holes can be made of a size where the droplet of catalyst that forms within the hole is sufficiently large to allow nanowire or nanopyramid growth. In this way, a regular array of nanowires or nanopyramids can be grown, even using Au catalysis.

Top Contact

In order to create some devices of the invention, the top of the nanowires or nanopyramids needs to comprise a top contact.

In one preferred embodiment, a top contact is formed using another graphitic layer. The invention then involves placing a graphitic layer on top of the formed nanowires or nanopyramids to make a top contact. It is preferred that the graphitic top contact layer is substantially parallel with the substrate layer. It will also be appreciated that the area of the graphitic layer does not need to be the same as the area of the substrate. It may be that a number of graphitic layers are required to form a top contact with a substrate with an array of nanowires or nanopyramids.

The graphitic layers used can be the same as those described in detail above in connection with the substrate. The top contact is graphitic, more especially it is graphene. This graphene substrate should contain no more than 10 layers of graphene or its derivatives, preferably no more than 5 layers (which is called as a few-layered graphene). Especially preferably, it is a one-atom-thick planar sheet of graphene.

The crystalline or "flake" form of graphite consists of many graphene sheets stacked together (i.e. more than 10 sheets). It is preferred if the top contact is 20 nm in thickness or less. Even more preferably, the graphitic top contact may be 5 nm or less in thickness.

When graphene contacts directly to the semiconductor nanowires or nanopyramids, it usually forms a Schottky contact which hinders the electrical current flow by creating a barrier at the contact junction. Due to this problem, the research on graphene deposited on semiconductors has been mainly confined to the use of graphene/semiconductor Schottky junctions.

Application of the top contact to the formed nanowires or nanopyramids can be achieved by any convenient method. Methods akin to those mentioned previously for transferring graphitic layers to substrate carriers may be used. The graphitic layers from Kish graphite, highly ordered pyrolytic graphite (HOPG), or CVD may be exfoliated by mechanical or chemical methods. Then they can be transferred into etching solutions such as HF or acid solutions to remove Cu (Ni, Pt, etc.) (especially for CVD grown graphitic layers) and any contaminants from the exfoliation process. The etching solution can be further exchanged into other solutions such as deionised water to clean the graphitic layers. The graphitic layers can then be easily transferred onto the formed nanowires or nanopyramids as the top contact. Again e-beam resist or photoresist may be used to support the thin graphitic layers during the exfoliation and transfer processes, which can be removed easily after deposition.

It is preferred if the graphitic layers are dried completely after etching and rinsing, before they are transferred to the top of the nanowire or nanopyramid arrays. To enhance the contact between graphitic layers and nanowires or nanopyramids a mild pressure and heat can be applied during this "dry" transfer.

Alternatively, the graphitic layers can be transferred on top of the nanowire or nanopyramid arrays, together with a solution (e.g. deionised water). As the solution dries off, the graphitic layers naturally form a close contact to underlying nanowires or nanopyramids. In this "wet" transfer method, the surface tension of the solution during the drying process might bend or knock out the nanowire or nanopyramid arrays. To prevent this, where this wet method is used, more robust nanowires or nanopyramids are preferably employed. Nanowires having a diameter of >80 nm might be suitable. One may also use the critical-point drying technique to avoid any damage caused by surface tension during the drying process. Another way to prevent this is to use supporting and electrically isolating material as fill-in material between nanowires or nanopyramids.

If there is a water droplet on a nanowire or nanopyramid array and attempts to remove it involve, for example a nitrogen blow, the water drop will become smaller by evaporation, but the drop will always try to keep a spherical form due to surface tension. This could damage or disrupt the nanostructures around or inside the water droplet.

Critical point drying circumvents this problem. By increasing temperature and pressure, the phase boundary between liquid and gas can be removed and the water can be removed easily.

Also doping of the graphitic top contact can be utilized. The major carrier of the graphitic top contact can be controlled as either holes or electrons by doping. It is preferable to have the same doping type in the graphitic top contact and in the semiconducting nanowires or nanopyramids.

It will be appreciated therefore that both top graphitic layer and the substrate can be doped. In some embodiments, the substrate and/or the graphitic layer is doped by a chemical method which involves with an adsorption of organic or inorganic molecules such as metal chlorides ($FeCl_3$, $AuCl_3$ or $GaCl_3$), $NO_2$, $HNO_3$, aromatic molecules or chemical solutions such as ammonia.

The surface of substrate and/or the graphitic layer could also be doped by a substitutional doping method during its growth with incorporation of dopants such as B, N, S, or Si.

Applications

Semiconductor nanowires or nanopyramids have wide ranging utility. They are semiconductors so can be expected to offer applications in any field where semiconductor technology is useful. They are primarily of use in integrated nanoelectronics and nano-optoelectronic applications.

An ideal device for their deployment might be a solar cell, LED or photodetector. One possible device is a nanowire or nanopyramid solar cell sandwiched between two graphene layers as the two terminals.

Such a solar cell has the potential to be efficient, cheap and flexible at the same time. This is a rapidly developing field and further applications on these valuable materials will be found in the next years. The same concept can be used to also fabricate other opto-electronic devices such as light-emitting diodes (LEDs), waveguides and lasers.

It will be appreciated that devices of the invention are provided with electrodes to enable charge to be passed into the device.

The invention will now be further discussed in relation to the following non limiting examples and figures.

The invention claimed is:

1. A composition of matter comprising:
a graphitic substrate;
a seed layer having a thickness of 50 nm or less deposited directly on top of the graphitic substrate; and
an oxide or nitride masking layer directly on top of the seed layer;
wherein a plurality of holes are present through the seed layer and through the masking layer to the graphitic substrate;
wherein a plurality of nanowires or nanopyramids are grown epitaxially from the graphitic substrate in the plurality of holes, wherein the plurality of nanowires or nanopyramids comprise at least one semiconducting group III-V compound; and
wherein the surface of the graphitic substrate is chemically and/or physically modified in the plurality of holes to enhance the epitaxial growth of the plurality of nanowires or nanopyramids.

2. The composition of claim 1, wherein the seed layer is a metallic layer or a layer of oxidized or nitridized metal.

3. The composition of claim 1, wherein the graphitic substrate is graphene.

4. The composition of claim 1, wherein the graphitic substrate has a thickness of 20 nm or less.

5. The composition of claim 1, wherein the seed layer is a metal layer comprising Sc, Ti, V, Cr, Mn, Fe, Co, Ni, Cu, Zn, B, Al, Si, Ge, Sb, Ta, W, or Nb, or an oxidized layer thereof.

6. The composition of claim 1, wherein the masking layer comprises a metal oxide or metal nitride.

7. The composition of claim 1, wherein the masking layer comprises $Al_2O_3$, $TiO_2$, $SiO_2$, AlN, BN or $Si_3N_4$.

8. The composition of claim 1, wherein the composition further comprises a support, such that the graphitic substrate is carried on the support and the seed layer is deposited on top of the graphitic substrate opposite the support, and the support comprises a semiconductor substrate, transparent glass, AlN or silicon carbide.

9. The composition of claim 8, wherein the support comprises a semiconductor substrate comprising crystalline Si or GaAs with a crystal orientation of [111], [110], or [100] perpendicular to the surface; or a transparent glass of fused silica or fused alumina.

10. The composition of claim 1, wherein the plurality of nanowires or nanopyramids are doped.

11. The composition of claim 1, wherein the plurality of nanowires or nanopyramids are a plurality of core-shell nanowires or nanopyramids or a plurality of radially heterostructured nanowires or nanopyramids.

12. The composition of claim 1, wherein the plurality of nanowires or nanopyramids are a plurality of axially heterostructured nanowires or nanopyramids.

13. The composition of claim 1, further comprising a graphitic top contact layer present on top of the plurality of nanowires or nanopyramids.

14. The composition of claim 1, wherein the masking layer comprises at least two different layers.

15. A process comprising:
(I) providing a graphitic substrate on a support and depositing a seed layer on the graphitic substrate, the seed layer having a thickness of 50 nm or less;
(II) oxidising or nitridizing the seed layer to form an oxidised or nitridized seed layer;
(III) introducing a plurality of holes in the oxidised or nitridized seed layer the holes penetrating to the graphitic substrate; and
(IV) growing a plurality of semiconducting group III-V nanowires or nanopyramids in the plurality of holes.

16. The process of claim 15, wherein the graphitic substrate comprises CVD grown single or multi-layer graphene on a metal catalyst layer; and
wherein the process further comprises:

depositing a polymer layer on the oxidized or nitridized seed layer before introducing the plurality of holes;

transferring the graphitic substrate from the metal catalyst layer to a second support using the polymer layer as a scaffold for the transfer; and introducing the plurality of holes such that the plurality of holes penetrate through all layers present to the graphitic substrate on the second substrate.

17. The process of claim 16, wherein transferring the graphitic substrate comprises an electrochemical delamination method employing an aqueous electrolyte comprising an acid, hydroxide, carbonate, or chloride solution.

18. A process comprising:
(I) providing a graphitic substrate on a support and depositing a seed layer on the graphitic substrate, the seed layer having a thickness of 50 nm or less;
(II) depositing an oxide or nitride masking layer on the seed layer;
(III) introducing a plurality of holes in the seed layer and the masking layer, the holes penetrating to the graphitic substrate; and
(IV) growing a plurality of semiconducting group III-V nanowires or nanopyramids in the plurality of holes.

19. The process of claim 18, wherein the graphitic substrate comprises CVD grown single or multi-layer graphene on a metal catalyst layer; and wherein the process further comprises:
depositing a polymer layer on the masking layer before introducing the plurality of holes;

transferring the graphitic substrate from the metal catalyst layer to a second support using the polymer layer as a scaffold for the transfer; and introducing the plurality of holes such that the plurality of holes penetrate through all layers present to the graphitic substrate on the second substrate.

* * * * *